(12) United States Patent
Yoshida et al.

(10) Patent No.: US 9,708,718 B2
(45) Date of Patent: *Jul. 18, 2017

(54) HYDROGEN PRODUCTION DEVICE AND METHOD FOR PRODUCING HYDROGEN

(75) Inventors: Akihito Yoshida, Osaka (JP); Shunsuke Sata, Osaka (JP); Masaki Kaga, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 1019 days.

This patent is subject to a terminal disclaimer.

(21) Appl. No.: 13/577,505

(22) PCT Filed: Dec. 20, 2010

(86) PCT No.: PCT/JP2010/072899
§ 371 (c)(1),
(2), (4) Date: Sep. 4, 2012

(87) PCT Pub. No.: WO2011/096142
PCT Pub. Date: Aug. 11, 2011

(65) Prior Publication Data
US 2013/0015076 A1    Jan. 17, 2013

(30) Foreign Application Priority Data

Feb. 8, 2010 (JP) .................................. 2010-025590
Sep. 28, 2010 (JP) .................................. 2010-217639

(51) Int. Cl.
*C25B 1/02* (2006.01)
*H01L 31/046* (2014.01)
(Continued)

(52) U.S. Cl.
CPC ................. *C25B 1/02* (2013.01); *C01B 3/04* (2013.01); *C01B 13/0207* (2013.01);
(Continued)

(58) Field of Classification Search
CPC .......... C25B 1/02; C25B 1/003; H01L 31/046; H01L 31/076; H01L 31/0682; C01B 3/04;
(Continued)

(56) References Cited

U.S. PATENT DOCUMENTS 4,011,149 A * 3/1977 Nozik ............................ 205/340
4,021,323 A * 5/1977 Kilby et al. ................... 136/246
(Continued)

FOREIGN PATENT DOCUMENTS

GB         2 414 243 A     11/2005
JP         63150869 A   *  6/1988
(Continued)

OTHER PUBLICATIONS

International Search Report for PCT/JP2010/072899 mailed Mar. 22, 2011.
(Continued)

*Primary Examiner* — Keith Hendricks
*Assistant Examiner* — Colleen M Raphael
(74) *Attorney, Agent, or Firm* — Nixon & Vanderhye P.C.

(57) ABSTRACT

There is provided a hydrogen production device which is high in the light use efficiency and can produce hydrogen with high efficiency without decreasing the hydrogen generation rate.

The hydrogen production device according to the present invention comprises: a photoelectric conversion part having a light acceptance surface and a back surface; a first gas generation part and a second gas generation part provided on the back surface, wherein one of the first gas generation part and the second gas generation part is a hydrogen generation part to generate $H_2$ from an electrolytic solution, and the other thereof is an oxygen generation part to generate $O_2$ from the electrolytic solution, and at least one of the first gas generation part and the second gas generation part is plural, (Continued)

and the photoelectric conversion part is electrically connected to the first gas generation part and the second gas generation part so that an electromotive force generated by a light acceptance of the photoelectric conversion part is supplied to the first gas generation part and the second gas generation part.

22 Claims, 9 Drawing Sheets

(51) Int. Cl.

| | |
|---|---|
| C01B 3/04 | (2006.01) |
| C25B 1/00 | (2006.01) |
| H01L 31/068 | (2012.01) |
| H01L 31/076 | (2012.01) |
| C01B 13/02 | (2006.01) |
| H01L 31/0465 | (2014.01) |

(52) U.S. Cl.
CPC ............ C25B 1/003 (2013.01); H01L 31/046 (2014.12); H01L 31/0465 (2014.12); H01L 31/0682 (2013.01); H01L 31/076 (2013.01); Y02E 10/547 (2013.01); Y02E 10/548 (2013.01); Y02E 60/364 (2013.01); Y02P 20/133 (2015.11)

(58) Field of Classification Search
CPC . C01B 13/0207; Y02E 10/548; Y02E 10/547; Y02E 60/364; Y02P 20/133
USPC ........ 205/340; 204/157.52, 242, 178, 157.5; 136/252–256
See application file for complete search history.

(56) References Cited

U.S. PATENT DOCUMENTS

| | | | | |
|---|---|---|---|---|
| 4,090,933 | A | * | 5/1978 | Nozik ........................... 205/340 |
| 4,094,751 | A | * | 6/1978 | Nozik ........................ 204/157.52 |
| 4,211,620 | A | * | 7/1980 | Fowler ......................... 205/340 |
| 4,466,869 | A | * | 8/1984 | Ayers ........................... 205/340 |
| 4,492,743 | A | * | 1/1985 | Howe .................... C25B 1/003 136/255 |
| 4,525,436 | A | * | 6/1985 | Yamazaki ..................... 205/340 |
| 4,528,252 | A | * | 7/1985 | Yamazaki ..................... 205/340 |
| 4,634,641 | A | * | 1/1987 | Nozik .................... C25B 1/003 429/111 |
| 4,643,817 | A | * | 2/1987 | Appleby ....................... 205/340 |
| 4,790,916 | A | * | 12/1988 | Murphy et al. ............... 205/340 |
| 4,793,910 | A | * | 12/1988 | Smotkin et al. .............. 205/340 |
| 5,785,768 | A | * | 7/1998 | Nakata .......................... 205/340 |
| 6,198,037 | B1 | * | 3/2001 | Nakata .......................... 136/246 |
| 6,936,143 | B1 | | 8/2005 | Graetzel et al. |
| 7,271,334 | B2 | | 9/2007 | Gratzel et al. |
| 8,337,708 | B2 | * | 12/2012 | Lin .......................... 204/157.52 |
| 8,632,663 | B2 | * | 1/2014 | Yoshida .................... C01B 3/04 205/340 |
| 2005/0139252 | A1 | * | 6/2005 | Shim ................. H01L 31/03529 136/255 |
| 2005/0211290 | A1 | | 9/2005 | Deng et al. |
| 2008/0073205 | A1 | | 3/2008 | Adiga et al. |
| 2008/0213641 | A1 | * | 9/2008 | Ostermann et al. .......... 204/242 |
| 2008/0223439 | A1 | | 9/2008 | Deng et al. |
| 2009/0269875 | A1 | * | 10/2009 | Kato ................... H01L 31/0201 438/58 |
| 2011/0056550 | A1 | * | 3/2011 | Choi ................. H01L 31/02167 136/256 |
| 2011/0186112 | A1 | * | 8/2011 | Aernouts .......... H01L 31/02021 136/249 |
| 2013/0180862 | A1 | | 7/2013 | Yoshida et al. |

FOREIGN PATENT DOCUMENTS

| | | |
|---|---|---|
| JP | 05-166921 | 7/1993 |
| JP | 2000-192275 | 7/2000 |
| JP | 2002-249031 | 9/2002 |
| JP | 2003-288955 | 10/2003 |
| JP | 2004-197167 | 7/2004 |
| JP | 2004315942 A * | 11/2004 |
| JP | 2005-324152 | 11/2005 |
| JP | 2006-508253 | 3/2006 |
| JP | 2006-89336 | 4/2006 |
| JP | 2008-507464 | 3/2008 |
| JP | 2009-274891 | 11/2009 |
| WO | WO 02/09876 | 2/2002 |
| WO | WO 2005/113859 | 12/2005 |

OTHER PUBLICATIONS

N. Lewia et al., "Powering the Planet: Chemical Challenges in Solar Energy Utilization", PNAS, Oct. 24, 2006, vol. 103, No. 43, pp. 15729-15735.
G.H. Lin et al., "One Step Method to Produce Hydrogen by a Triple Stack Amorphous Silicon Solar Cell", Appl. Phys. Lett. 55(4), 24, Jul. 1989, pp. 386-387.
S. Yamane et al., "Efficient Solar Water Splitting with a Composite "n-Si/p-Cul/n-i-p a-Si/n-p Gap/RuO$_2$"", Journal of Physical Chemistry (2009), 113, pp. 14575-14581.
Y. Yamada et al., "One Chip Photovoltaic Water Electrolysis Device", International Journal of Hydrogen Energy, 28 (2003), pp. 1168-1169.
International Search Report for PCT/JP2011/068170 mailed Nov. 22, 2011.
Delahoy et al, A One-Unit Photovoltaic Electrolysis System Based on a Triple Stack of Amorphous Silicon (pin) Cells, International Journal of Hydrogen Energy, Elsevier Science Publishers B.V., Barking, GB, vol. 10, No. 2, Jan. 1, 1985 (Jan. 1, 1985).

* cited by examiner

HYDROGEN PRODUCTION DEVICE AND METHOD FOR PRODUCING HYDROGEN

This application is the U.S. national phase of International Application No. PCT/JP2010/072899 filed 20 Dec. 2010 which designated the U.S. and claims priority to JP 2010-025590 filed 8 Feb. 2010, and JP 2010-217639 filed 28 Sep. 2010, the entire contents of each of which are hereby incorporated by reference.

TECHNICAL FIELD

The present invention relates to a hydrogen production device and a method for producing hydrogen.

BACKGROUND ART

Recently, renewable energy is expected to be used in view of exhaustion of fossil fuel resources and emission limitation of global greenhouse gas. The renewable energy is generated from various kinds of resources such as sunlight, hydro power, wind power, geothermal heat, tidal power, and biomass, among which, since the sunlight is large in utilizable energy amount and relatively small in geographical constraint as compared with the other renewable energy resources, a technique to efficiently produce utilizable energy from the sunlight is expected to be developed and become widely used in an early stage.

The utilizable energy produced from the sunlight include electric energy produced by a solar cell or a solar thermal turbine, thermal energy produced by collecting solar energy to a heat medium, and stockable fuel energy such as a liquid fuel or hydrogen produced by reducing a substance with the sunlight. While many solar cell techniques and solar heat utilization techniques have been already put to practical use, these techniques are being developed to be improved because energy use efficiency is still low and costs to produce electricity and heat are still high. Furthermore, although the energy in the forms of electricity, heat, and the like can be used to complement a short-term energy fluctuation, there are problems that it is very difficult to complement a long-term fluctuation such as a seasonal fluctuation, and that operation rates of electric power facilities could be lowered due to an increase in energy amount. Meanwhile, to store energy as a substance such as the liquid fuel or hydrogen is extremely important as a technique to efficiently complement the long-term fluctuation and improve the operation rates of the electric power facilities, and it is the indispensable technique to maximally enhance the energy use efficiency and thoroughly reduce a carbon dioxide emission amount in the future.

Stockable fuels can be roughly classified into forms of a liquid fuel such as carbon hydride, a gas fuel such as a biogas or hydrogen, and a solid fuel such as a biomass-derived wood pellet or a metal reduced by the sunlight. Each of these forms have good and bad points such that the liquid fuel is advantageous in view of easiness of infrastructure construction and an energy density, the gas fuel such as hydrogen is advantageous in view of total use efficiency improvement with a fuel cell, and the solid fuel is advantageous in view of stockability and an energy density, among which, a hydrogen producing technique to decompose water by the sunlight especially attracts attention because easily available water can be used as a raw material.

Methods for producing hydrogen using solar energy and water as a raw material include a photolysis method in which platinum is supported on a photocatalyst such as titanium oxide, this material is put into water and a charge is separated in a semiconductor by light irradiation, and a proton is reduced and water is oxidized in an electrolytic solution, a pyrolysis method in which water is directly pyrolyzed at high temperature by use of thermal energy in a high-temperature gas furnace, or water is indirectly pyrolyzed by conjugating metallic redox, a biological method utilizing metabolism of a microbe such as an alga using light, a water electrolysis method in which electricity generated by a solar cell is combined with a hydrogen production device for water electrolysis, and a photovoltaic method in which a hydrogen generation catalyst and an oxygen generation catalyst are supported on a photoelectric conversion material used in a solar cell, and the hydrogen generation catalyst and the oxygen generation catalyst are used in reactions of electron and hole provided by photoelectric conversion. Among them, the photolysis method, the biological method, and the photovoltaic method are regarded as having a possibility to produce a small-size hydrogen production device by integrating a photoelectric conversion part and a hydrogen generation part, but it is believed that the photovoltaic method is one of the most possible techniques to be practically used in view of conversion efficiency of energy from sunlight.

There have been disclosed examples of the hydrogen production device in which photoelectric conversion is integrated with hydrogen generation by the photolysis method or the photovoltaic method. As for the photolysis method, Patent document 1 discloses a device using a photocatalytic electrode of titanium oxide adsorbing a ruthenium complex, a platinum electrode, and redox of iodine or iron. Further, Patent documents 2 and 3 employ an integral structure by connecting two photocatalytic layers in tandem, connecting a platinum counter electrode, and sandwiching an ion exchanging film therebetween. Meanwhile, as for the photovoltaic method, there is disclosed a concept of a hydrogen production device integrally provided with a photoelectric conversion part, a hydrogen generation part, and the oxygen generation part (Non-patent document 1). According to this document, charge separation is performed by the photoelectric conversion part, and hydrogen generation and oxygen generation are performed by using catalysts respectively corresponding to them. The photoelectric conversion part is made of a material used in a solar cell. For example, according to Non-patent document 2, after charge separation is performed on three silicon p-i-n layers, hydrogen generation is undertaken by a platinum catalyst, and oxygen generation is undertaken by ruthenium oxide. Further, according to Patent document 3, the efficiency is improving by using a multi junction photoelectric conversion material adsorbing light at multiple wavelengths, Pt as a hydrogen generation catalyst, and $RuO_2$ as a oxygen generation catalyst. Meanwhile, according to Patent document 4 and Non-patent document 3, an integral hydrogen generation device is produced by laminating a hydrogen generation catalyst (NiFeO) and three silicon p-i-n layers in parallel on a substrate, and supporting an oxygen generation catalyst (Co—Mo) on the silicon layer.

PRIOR ART DOCUMENTS

Patent Documents

Patent document 1: Japanese Unexamined Patent Publication No. 2006-89336
Patent document 2: Japanese Unexamined Patent Publication No. 2003-504799

Patent document 3: Japanese Unexamined Patent Publication No. 2004-504934
Patent document 4: Japanese Unexamined Patent Publication No. 2003-288955

Non-Patent Documents

Non-patent document 1: Proceedings of the National Academy of Sciences of the United States of America, 2006, Vol. 43, Pages 15729 to 15735
Non-patent document 2: Applied Physics Letters, 1989, Vol. 55, Pages 386 to 387
Non-patent document 3: Journal of Physical Chemistry, 2009, Vol. 113, Pages 14575 to 14581
Non-patent document 4: International Journal of Hydrogen Energy, 2003, Vol. 28, Pages 1167 to 1169

SUMMARY OF THE INVENTION

Problems to be Solved by the Invention

As described above, while some studies have been disclosed about a structure of the hydrogen production device in which the photoelectric conversion is integrated with the hydrogen generation, in order to produce hydrogen with higher efficiency, it is necessary to maximally enhance light use efficiency. For example, when a gas is generated in a light acceptance surface in a device, incident light is scattered by the generated gas, so that the incident light cannot be sufficiently used and light use efficiency is lowered, which is a serious problem. Furthermore, when a catalyst is supported on the light acceptance surface of the photoelectric conversion part, the incident light is reflected or absorbed by the catalyst, so that the light use efficiency also is problematically lowered. In addition, in order to prevent the light from being scattered, a method has been studied to electrically connect the light acceptance surface of the photoelectric conversion part to the oxygen catalyst using an electrode film, but since an area of the photoelectric conversion part is limited due to an area of another member (such as an oxygen generation catalyst) because of its structure, there is a problem that the light use efficiency cannot be prevented from being lowered. Moreover, in particular, with increasing size of the device, since the imbalance of the proton concentration causes between an electrolytic solution around the hydrogen generation catalyst and an electrolytic solution around the oxygen generation catalyst, the hydrogen generation rate are decreased, which is a problem.

The present invention was made in view of the above circumstances, and it is an object of the present invention to provide a hydrogen production device which is high in the light use efficiency and can produce hydrogen with high efficiency without decreasing the hydrogen generation rate.

Solutions to the Problems

The present invention provides a hydrogen production device comprising: a photoelectric conversion part having a light acceptance surface and a back surface; a first gas generation part and a second gas generation part provided on the back surface, wherein one of the first gas generation part and the second gas generation part is a hydrogen generation part to generate $H_2$ from an electrolytic solution, and the other thereof is an oxygen generation part to generate $O_2$ from the electrolytic solution, and at least one of the first gas generation part and the second gas generation part is plural, and the photoelectric conversion part is electrically connected to the first gas generation part and the second gas generation part so that an electromotive force generated by a light acceptance of the photoelectric conversion part is supplied to the first gas generation part and the second gas generation part.

Effects of the Invention

According to the present invention, the electromotive force can be generated in the photoelectric conversion part by irradiating the light acceptance surface of the photoelectric conversion part with light, and the electromotive force can be output to the first gas generation part and the second gas generation part. By bringing an electrolytic solution into contact with the first gas generation part and the second gas generation part to which the electromotive force was output, $H_2$ can be generated from the electrolytic solution in one of the first gas generation part and the second gas generation part, and $O_2$ can be generated from the electrolytic solution in the other thereof. Thus, hydrogen can be produced by collecting the generated $H_2$.

According to the present invention, since the hydrogen generation part and the oxygen generation part are provided on the back surface of the photoelectric conversion part, the light can enter the light acceptance surface without passing through the electrolytic solution, so that the incident light can be prevented from being absorbed and the incident light can be prevented from being scattered by the electrolytic solution. Thus, the incident light amount entering the photoelectric conversion part can be large, and the light use efficiency can be high.

In addition, according to the present invention, since the hydrogen generation part and the oxygen generation part are provided on the back surface of the photoelectric conversion part, the light entering the light acceptance surface is not absorbed or scattered by the hydrogen generation part and the oxygen generation part, as well as by hydrogen and oxygen generated from those parts, respectively. Thus, the incident light amount entering the photoelectric conversion part can be large, and the light use efficiency can be high.

According to the present invention, since the hydrogen generation part and the oxygen generation part are provided on the back surface of the photoelectric conversion part, the light acceptance surface of the photoelectric conversion part can be provided in a most part of the light acceptance surface of the hydrogen production device. Thus, the light use efficiency can be higher.

In addition, according to the present invention, since the photoelectric conversion part, the hydrogen generation part, and the oxygen generation part are provided in the same device, hydrogen producing cost can be cut as compared with a conventional device which combines a solar cell and a water electrolytic device.

In addition, according to the present invention, at least one of the first gas generation part and the second gas generation part is plural. Thus, it results in increasing a part where the first gas generation part is adjacent to the second gas generation part, and a distance that a proton is ion-conducted between an electrolytic solution around the first gas generation part and an electrolytic solution around the second gas generation part can be shortened. Further, a proton conduction path in the electrolytic solution or an ion-exchange material in which the proton is ion-conducted can be increased, and ratio of a proton conduction area can be increased. Thus, the concentration of conductive proton can be decreased.

Thereby, the proton moves easily in the electrolytic solution around the first gas generation part and the electrolytic solution around the second gas generation part, and the imbalance in the proton concentration can be decreased. As a result, the hydrogen generation rate can be prevented from decreasing. Further, even if the hydrogen production device becomes larger scale, and a lot of hydrogen is produced, reduction in the hydrogen generation rate due to the imbalance in the proton concentration can be prevented. In addition, the proton movement between the electrolytic solution around the first gas generation part and the electrolytic solution around the second gas generation part sometimes limits the hydrogen generation reaction, so that the hydrogen generation rate can be maximally enhanced by facilitating to move protons easily.

MODES FOR CARRYING OUT THE INVENTION

Figure 1:
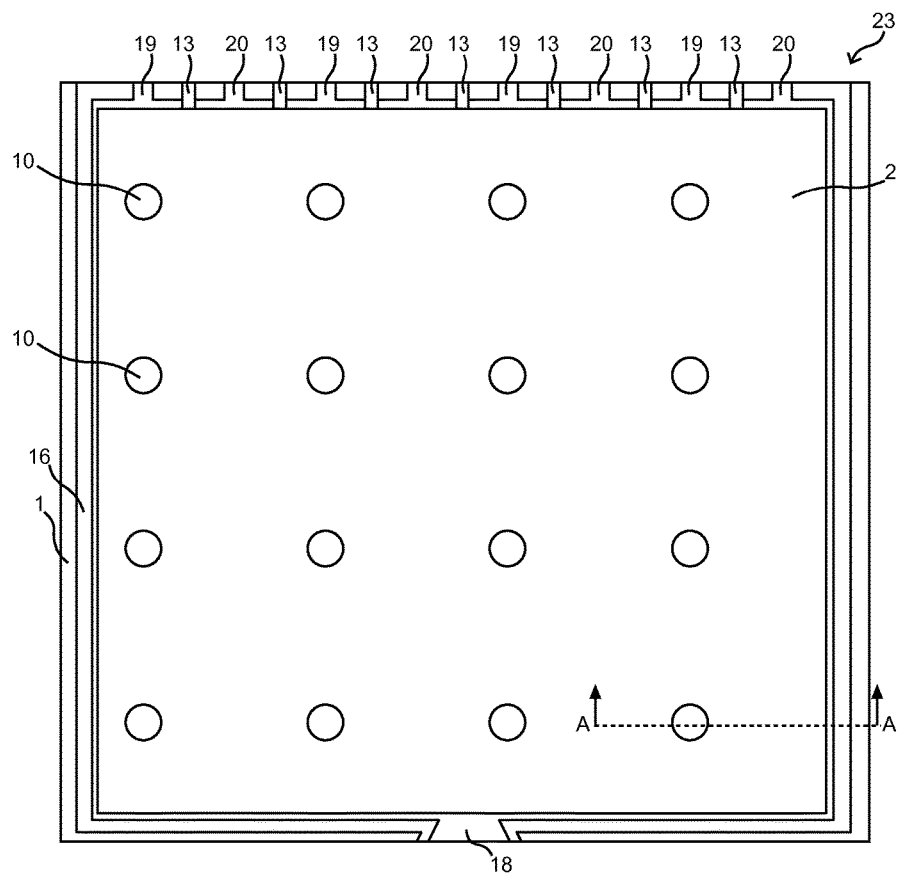
FIG. 1 is a schematic plan view showing a configuration of a hydrogen production device according to an embodiment of the present invention.

A hydrogen production device according to the present invention comprises a photoelectric conversion part having a light acceptance surface and a back surface; a first gas generation part and a second gas generation part provided on the back surface, wherein one of the first gas generation part and the second gas generation part is a hydrogen generation part to generate $H_2$ from an electrolytic solution, and the other thereof is an oxygen generation part to generate $O_2$ from the electrolytic solution, and at least one of the first gas generation part and the second gas generation part is plural, and the photoelectric conversion part is electrically connected to the first gas generation part and the second gas generation part so that an electromotive force generated by a light acceptance of the photoelectric conversion part is supplied to the first gas generation part and the second gas generation part.

The hydrogen production device can produce hydrogen from the electrolytic solution containing water.

The photoelectric conversion part receives light and generates electromotive force.

The light acceptance surface is the surface of the photoelectric conversion part to receive the light.

The back surface is the back surface of the light acceptance surface.

In the hydrogen production device according to the present invention, the first gas generation part and the second gas generation part are preferably provided alternately and in parallel.

According to the above configuration, a distance that a proton is ion-conducted between an electrolytic solution around the first gas generation part and an electrolytic solution around the second gas generation part can be more shortened.

In the hydrogen production device according to the present invention, it is preferable to further provide a partition wall between the first gas generation part and the second gas generation part.

According to the above configuration, hydrogen and oxygen generated in the first gas generation part and the second gas generation part, respectively, can be separated from each other, so that hydrogen can be more efficiently collected.

In the hydrogen production device according to the present invention, it is preferable that the partition wall is provided to separate the space between the first gas generation part and the second gas generation part.

According to the above configuration, hydrogen can be more efficiently collected.

In the hydrogen production device according to the present invention, the first gas generation part and the second gas generation part is preferably substantially rectangle, and the long side of the first gas generation part is preferably provided to adjoin that of the second gas generation part across the partition wall.

According to the above configuration, a distance that a proton is ion-conducted between an electrolytic solution around the first gas generation part and an electrolytic solution around the second gas generation part can be more shortened. In addition, the area that forms the first gas generation part and the second gas generation part can be widened, and the hydrogen generation amount can be increased. In addition, by being substantially rectangle, and providing them across the partition wall, the generated hydrogen or oxygen can be easily collected.

In the hydrogen production device according to the present invention, it is further preferable that a first gas exhaust opening is provided outside of one of short sides of the first gas generation part, and a second gas exhaust opening is provided outside of one of short sides of the second gas generation part, and the first gas exhaust opening and the second gas exhaust opening is preferably provided next to each other.

According to the above configuration, the generated hydrogen and oxygen can be easily collected.

In the hydrogen production device according to the present invention, it is preferable that both of the first gas exhaust opening and the second first gas exhaust opening are plural, the plurality of the first gas exhaust opening preferably conducts with one first gas exhaust path, and the plurality of the second gas exhaust opening preferably conducts with one second gas exhaust path.

According to the above configuration, the generated hydrogen and oxygen can be easily collected, and the convenience can be improved.

In the hydrogen production device according to the present invention, the partition wall preferably contains an ion-exchange material.

According to the above configuration, a proton concentration imbalance can be eliminated between the electrolytic solution introduced into the space above the first gas generation part, and the electrolytic solution introduced into the space above the second gas generation part, so that hydrogen and oxygen can be stably generated.

In the hydrogen production device according to the present invention, it is preferable that the first gas generation part is electrically connected to the back surface of the photoelectric conversion part, and that the second gas generation part is electrically connected to the light acceptance surface of the photoelectric conversion part through a first conductive part.

According to the above configuration, the electromotive force can be generated in the photoelectric conversion part by irradiating the light acceptance surface of the photoelectric conversion part with light, and a potential difference can be generated between the light acceptance surface and the back surface. Thus, a potential difference can be generated between the first gas generation part electrically connected to the back surface of the photoelectric conversion part and the second gas generation part electrically connected to the light acceptance surface of the photoelectric conversion part through the first conductive part. By bringing an electrolytic solution into contact with the first gas generation part and the second gas generation part having the potential difference therebetween, $H_2$ can be generated from the electrolytic solution in one of the first gas generation part and the second gas generation part, and $O_2$ can be generated from the electrolytic solution in the other thereof. Thus, hydrogen can be produced by collecting the generated $H_2$.

Furthermore, the photoelectric conversion part can be made of the uniform material over the whole surface. Thus, the light acceptance surface of the photoelectric conversion part can be large, and the production cost can be cut in the hydrogen production device.

In the hydrogen production device according to the present invention, the second gas generation part is preferably provided on the back surface of the photoelectric conversion part via an insulation part.

According to the above configuration, a leak current is prevented from flowing between the second gas generation part and the back surface of the photoelectric conversion part.

In the hydrogen production device according to the present invention, it is preferable that a second electrode is further provided between the back surface of the photoelectric conversion part and the first gas generation part.

According to the above configuration, a large current can flow between the back surface of the photoelectric conversion part and the first gas generation part by the electromotive force of the photoelectric conversion part, so that hydrogen or oxygen can be more efficiently generated.

In the hydrogen production device according to the present invention, it is preferable that the second electrode and the insulation part have a corrosion resistance and liquid-blocking properties to the electrolytic solution.

According to the above configuration, the photoelectric conversion part can be prevented from contacting with the electrolytic solution, and can be prevented from corroding with the electrolytic solution.

In the hydrogen production device according to the present invention, it is preferable that the insulation part is provided so as to cover the side of the photoelectric conversion part.

According to the above configuration, a second conductive part or a second gas generation part can be formed on the insulation part covering the side of the device, and can be provided to be in contact with the first electrode.

In the hydrogen production device according to the present invention, the first conductive part preferably includes a first electrode which is in contact with the light acceptance surface of the photoelectric conversion part, and a second conductive part which is in contact respectively with the first electrode and the second gas generation part.

According to the above configuration, the light acceptance surface of the photoelectric conversion part can be electrically connected to the second gas generation part, so that hydrogen or oxygen can be more efficiently generated.

In the hydrogen production device according to the present invention, the second conductive part is preferably provided in a contact hole penetrating the photoelectric conversion part.

According to the above configuration, the first electrode can be electrically connected to the second gas generation part, so that an area of the light acceptance surface of the photoelectric conversion part is suppressed from being reduced due to the presence of the second conductive part.

In the hydrogen production device according to the present invention, the second conductive part preferably has a cross-section which is parallel with the light acceptance surface of the photoelectric conversion part, and the cross-section preferably has an elongate shape which is parallel with a column-wise of the first gas generation part and the second gas generation part.

According to the above configuration, reduction in a potential accompanied by a charge movement between the light acceptance surface of the photoelectric conversion part and the second gas generation part can be decreased.

In the hydrogen production device according to the present invention, the second conductive part is preferably provided so as to cover the side of the photoelectric conversion part.

According to the above configuration, the second gas generation part can be electrically connected to the light acceptance surface of the photoelectric conversion part without forming a contact hole in the photoelectric conversion part, and producing cost can be cut.

In the hydrogen production device according to the present invention, the first conductive part preferably includes a first electrode which is in contact with the light acceptance surface of the photoelectric conversion part, and the first electrode is preferably in contact with the second gas generation part.

According to the above configuration, a potential difference between the light acceptance surface of the photoelectric conversion part and the second gas generation part can be further decreased.

In the hydrogen production device according to the present invention, the second gas generation part is preferably provided so as to cover the side of the photoelectric conversion part.

According to the above configuration, the second gas generation part can be electrically connected to the light acceptance surface of the photoelectric conversion part without forming a contact hole in the photoelectric conversion part, and producing cost can be cut.

In the hydrogen production device according to the present invention, the photoelectric conversion part is preferably provided on a substrate having translucency.

According to the above configuration, the photoelectric conversion part which needs to be formed over the substrate can be applied to the hydrogen production device according to the present invention. In addition, the hydrogen production device according to the present invention can be easily handled.

In the hydrogen production device according to the present invention, the photoelectric conversion part preferably has a photoelectric conversion layer formed of a p-type semiconductor layer, an i-type semiconductor layer, and an n-type semiconductor layer.

According to the above configuration, the photoelectric conversion part can have a pin structure, so that the photoelectric conversion can be efficiently performed. In addition, the more electromotive force can be generated in the photoelectric conversion part, so that the electrolytic solution can be more efficiently electrolyzed.

In the hydrogen production device according to the present invention, the photoelectric conversion part comprises a plurality of the photoelectric conversion layers connected in series, and the plurality of the photoelectric conversion layers preferably output the electromotive force generated by receiving light to the first gas generation part and the second gas generation part.

According to the above configuration, the photoelectric conversion part can generate the electromotive force so that can generate hydrogen by decomposing water.

In the hydrogen production device according to the present invention, each photoelectric conversion layer is preferably connected in series with a third conductive part.

According to the above configuration, each photoelectric conversion layer can be provided to arrange each other.

In the hydrogen production device according to the present invention, the third conductive part preferably comprises a translucent electrode provided on the side of the light acceptance surface of the photoelectric conversion layer, and a backside electrode provided on the side of the back surface of the photoelectric conversion layer.

According to the above configuration, each photoelectric conversion layer provided to arrange each other can be connected in series.

In the hydrogen production device according to the present invention, it is preferable that an insulation part is further provided between the back surface of the photoelectric conversion part and the second gas generation part, and a fourth conductive part is further provided between the insulation part and the second gas generation part.

According to the above configuration, when the electromotive force generated by the light acceptance of the photoelectric conversion part is output to the second gas generation part, internal resistance can be minimized.

In the hydrogen production device according to the present invention, it is preferable that an insulation part is further provided between the back surface of the photoelectric conversion part and the first gas generation part, and a fifth conductive part is further provided between the insulation part and the first gas generation part.

According to the above configuration, when the electromotive force generated by the light acceptance of the photoelectric conversion part is output to the first gas generation part, internal resistance can be minimized.

In the hydrogen production device according to the present invention, the hydrogen generation part and the oxygen generation part preferably include a catalyst for a reaction to generate $H_2$ from the electrolytic solution, and a catalyst for a reaction to generate $O_2$ from the electrolytic solution, respectively.

According to the above configuration, the reaction rate to generate $H_2$ from the electrolytic solution can increase in the hydrogen generation part, and the reaction rate to generate $O_2$ from the electrolytic solution can increase in the oxygen generation part. Therefore, $H_2$ can be more efficiently generated by the electromotive force generated in the photoelectric conversion part, and light use efficiency can be improved.

In the hydrogen production device according to the present invention, at least one of the hydrogen generation part and the oxygen generation part is preferably a catalyst-supporting porous conductor. According to the above configuration, at least one of the first gas generation part and the second gas generation part has the large catalytic surface area, so that oxygen or hydrogen can be more efficiently generated. In addition, by using the porous conductor, a potential can be suppressed from varying due to the current flowing between the photoelectric conversion part and the catalyst, so that hydrogen or oxygen can be more efficiently generated.

In the hydrogen production device according to the present invention, it is preferable that the photoelectric conversion part is provided on the substrate having translucency, a plate is further provided over the first gas generation part and the second gas generation part so as to be opposed to the substrate, and a space is provided between the first and the second gas generation parts and the plate.

According to the above configuration, the electrolytic solution can be introduced between each of the first gas generation part and the second gas generation part, and the plate, and $H_2$ and $O_2$ can be efficiently generated from the electrolytic solution in the first gas generation part and the second gas generation part.

In the hydrogen production device according to the present invention, it is preferable to further provide a partition wall between the first gas generation part and the second gas generation part, the partition wall is provided to separate the space between the first gas generation part and the plate, and the space between the second gas generation part and the plate.

According to the above configuration, hydrogen and oxygen generated in the first gas generation part and the second gas generation part, respectively, can be separated from each other, so that hydrogen can be more efficiently collected.

In addition, the present invention provides a method for producing hydrogen, which includes the steps of setting the hydrogen production device according to the present invention such that the light acceptance surface of the photoelectric conversion part is tilted with respect to a horizontal surface, generating hydrogen and oxygen from the hydrogen generation part and the oxygen generation part respectively by introducing the electrolytic solution from a lower part of the hydrogen production device to the hydrogen production device and irradiating the light acceptance surface of the photoelectric conversion part with sunlight, and exhausting the hydrogen and the oxygen from an upper part of the hydrogen production device.

According to the method for producing hydrogen in the present invention, hydrogen can be produced at low cost, using sunlight.

Hereinafter, the present invention will be described by embodiments as shown in the drawings. The configurations shown in the drawings and in the following description are just examples, and the scope of the present invention is not limited to those shown in the drawings and in the following description.

Configuration of Hydrogen Production Device

Figure 2:
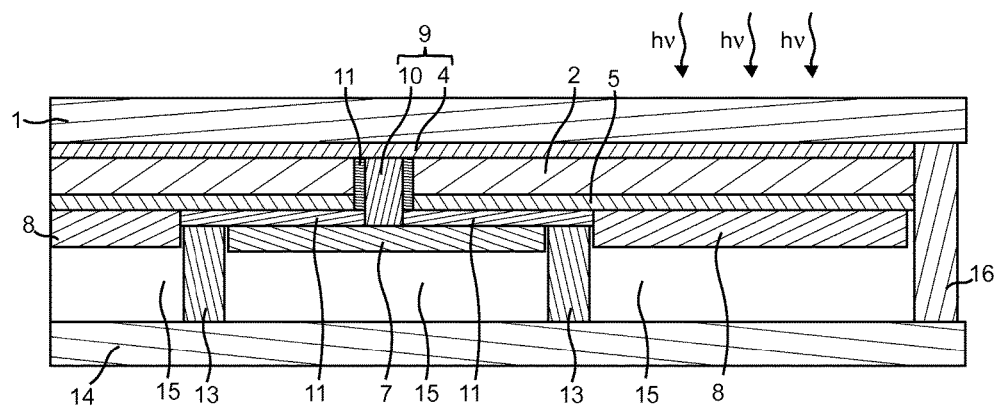
FIG. 2 is a schematic cross-sectional view taken along a dotted line A-A in FIG. 1.
Figure 3:
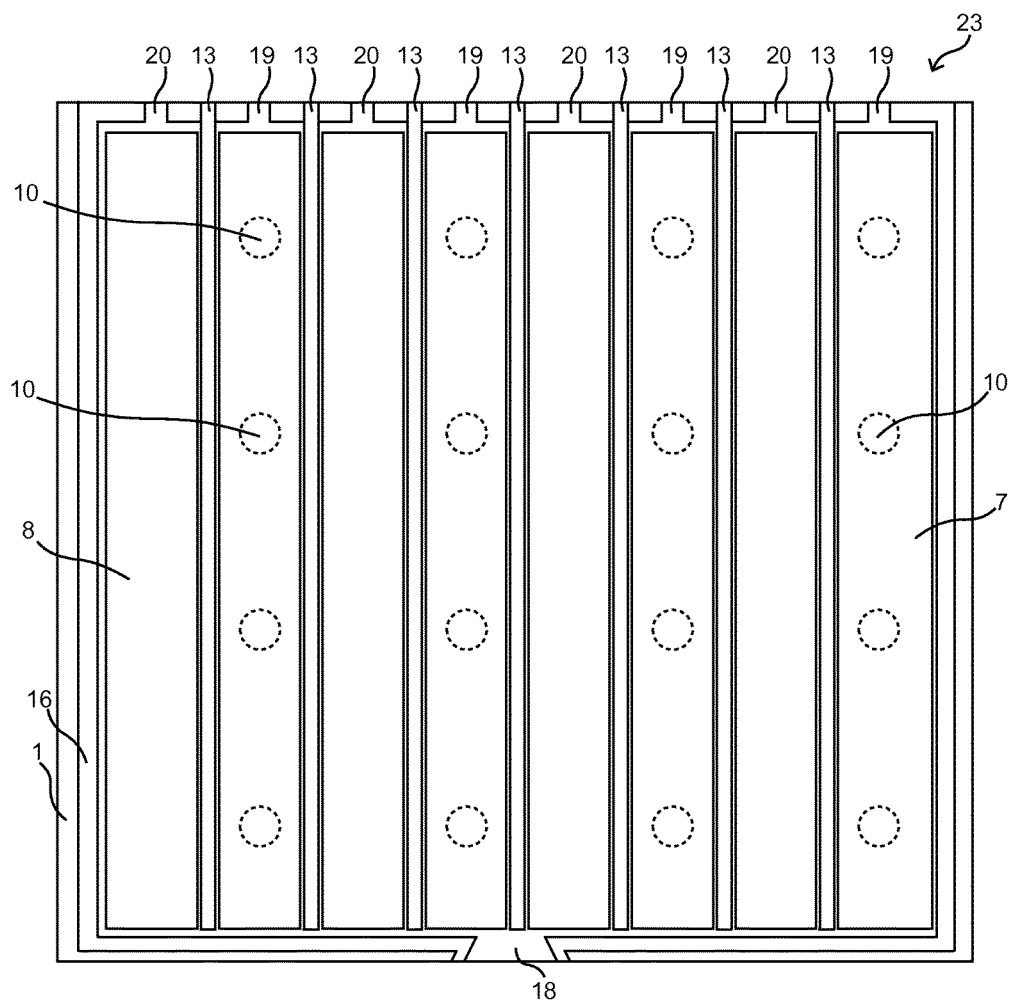
FIG. 3 is a schematic back surface view showing the configuration of the hydrogen production device according to the embodiment of the present invention.
Figure 9:
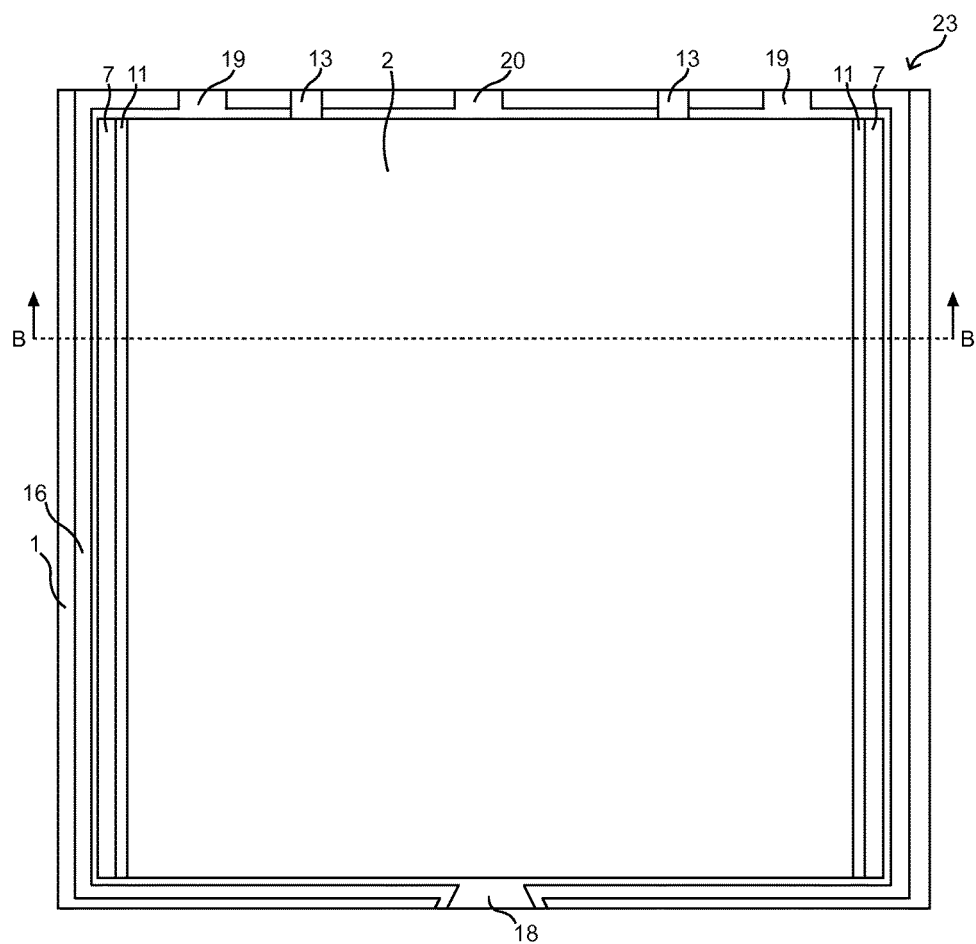
FIG. 9 is a schematic plan view showing a configuration of a hydrogen production device according to an embodiment of the present invention.
Figure 10:
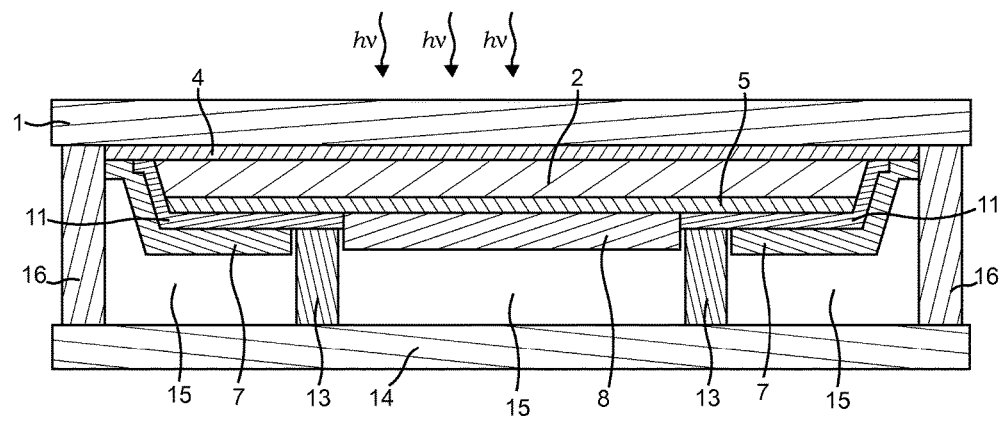
FIG. 10 is a schematic cross-sectional view taken along a dotted line B-B in FIG. 9.

FIG. 1 shows a configuration of a hydrogen production device according to an embodiment of the present invention, and it is a schematic plan view taken from the side of a light acceptance surface of a photoelectric conversion part. FIG. 2 is a schematic cross-sectional view taken along a dotted line A-A in FIG. 1. FIG. 3 shows a configuration of the hydrogen production device according to the embodiment of the present invention, and it is a schematic back surface view taken from the side of a back surface of the photoelectric conversion part. In addition, FIG. 9 shows a configuration of a hydrogen production device according to an embodiment of the present invention, and it is a schematic plan view taken from the side of a light acceptance surface of a photoelectric conversion part, and FIG. 10 is a schematic cross-sectional view taken along a dotted line B-B in FIG. 9.

A hydrogen production device 23 in this embodiment includes a photoelectric conversion part 2 having a light acceptance surface and a back surface, a first gas generation part 8 provided on the back surface, and a second gas generation part 7 provided on the back surface, in which one of the first gas generation part 8 and the second gas generation part 7 is a hydrogen generation part to generate $H_2$ from an electrolytic solution and the other thereof is an oxygen generation part to generate $O_2$ from the electrolytic solution, and at least one of the first gas generation part 8 and the second gas generation part 7 is plural, and the photoelectric conversion part 2 is electrically connected to the first gas generation part 8 and the second gas generation part 7 so that an electromotive force generated by a light acceptance of the photoelectric conversion part 2 is supplied to the first gas generation part 8 and the second gas generation part 7.

Further, the first conductive part 9 included in the hydrogen production device 23 in this embodiment may be formed of a first electrode 4 and a second conductive part 10, or may be formed of the first electrode 4 only. In addition, the hydrogen production device 23 in this embodiment may be provided with a substrate 1, a second electrode 5, an insulation part 11, a partition wall 13, a plate 14, an electrolytic solution path 15, a seal material 16, a water intake 18, a first gas exhaust opening 20, a second gas exhaust opening 19, and a first gas exhaust path 25, and a second gas exhaust path 26.

Hereinafter, the hydrogen production device in this embodiment will be described.

1. Substrate

The substrate 1 may be provided in the hydrogen production device 23 in this embodiment. Further, the photoelectric conversion part 2 may be provided on the translucent substrate 1 with the light acceptance surface being on the side of the substrate 1. In a case where the photoelectric conversion part 2 serves as a semiconductor substrate or the like and has certain strength, the substrate 1 may not be provided. In a case where the photoelectric conversion part 2 can be formed on a flexible material such as a resin film, the substrate 1 may not be provided.

The substrate 1 is the member serving as a base to constitute the hydrogen production device. Further, in order to receive sunlight on the light acceptance surface of the photoelectric conversion part 2, it is preferably transparent and has a high light transmittance but the light transmittance is not limited as long as it has such a structure that light can efficiently enter the photoelectric conversion part 2.

Substrate materials having a high light transmittance preferably include transparent rigid materials such as soda glass, quartz glass, Pyrex (registered trademark), and synthetic quartz plate, a transparent resin plate, and a film material. A glass substrate is preferably used because it is chemically and physically stable.

The surface of the substrate 1 on the side of the photoelectric conversion part 2 may have a fine concavo-convex structure so that the incident light can be effectively irregularly reflected on the surface of the photoelectric conversion part 2. This fine concavo-convex structure can be formed by a well-known method such as a reactive ion etching (RIE) process or a blast process.

2. First Conductive Part

The first conductive part 9 electrically connects the second gas generation part 7 to the light acceptance surface of the photoelectric conversion part 2. In addition, the first conductive part 9 may be formed of one member or may be formed of the first electrode 4 and the second conductive part 10. By providing the first conductive part 9, a potential of the light acceptance surface of the photoelectric conversion part 2 can be almost the same as a potential of the second gas generation part 7, so that hydrogen or oxygen can be generated in the second gas generation part 7.

When the first conductive part 9 is formed of one member, such a member may be a metal wiring to electrically connect the light acceptance surface of the photoelectric conversion part 2 to the second gas generation part 7. In addition, the member is a metal wiring formed of Ag, for example. Further, the metal wiring may have a shape like a finger electrode so as to prevent the light entering the photoelectric conversion part 2 from being reduced. The first conductive part 9 may be provided on the substrate 1 on the side of the photoelectric conversion part 2, or may be provided on the light acceptance surface of the photoelectric conversion part 2. In addition, the first conductive part 9 may be a first electrode 4, for example as shown in FIGS. 10-13, the second gas generation part 7 may be provided so as to be in contact with the first electrode 4.

3. First Electrode

Figure 11:
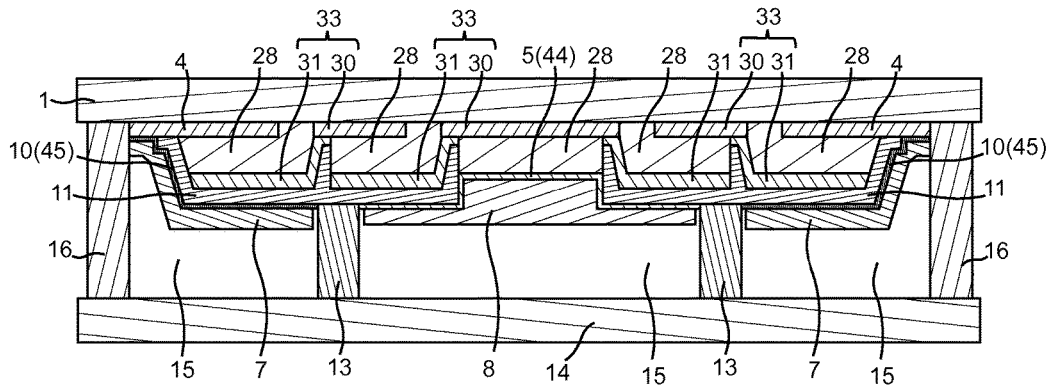
FIG. 11 is a schematic cross-sectional view showing a configuration of a hydrogen production device according to an embodiment of the present invention.
Figure 13:
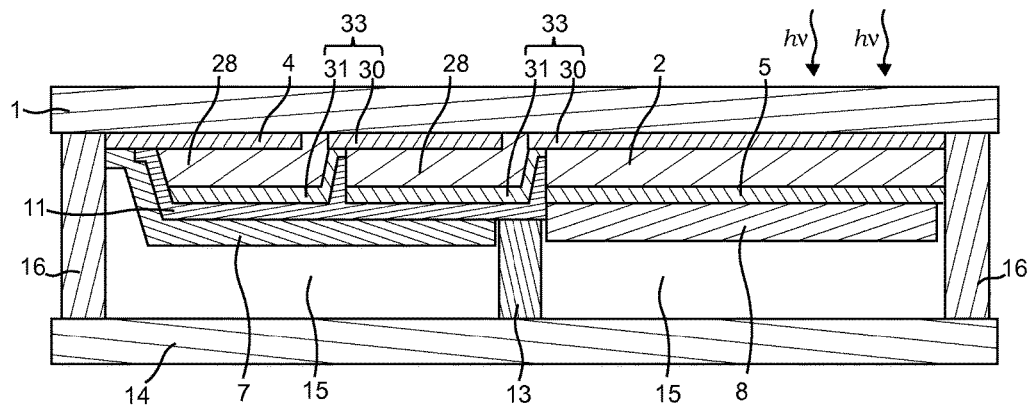
FIG. 13 is a schematic cross-sectional view showing a configuration of a hydrogen production device according to a reference embodiment of the present invention.

The first electrode 4 can be provided on the substrate 1, and can be provided so as to be in contact with the light acceptance surface of the photoelectric conversion part 2. Alternatively, the first electrode 4 may have translucency. In a case where the substrate 1 may not be provided, the first electrode 4 may be directly provided on the light acceptance surface of the photoelectric conversion part 2. By providing the first electrode 4, a larger current flows between the light acceptance surface of the photoelectric conversion part 2 and the second gas generation part 7. The first electrode 4 may be provided on the whole surface of the light acceptance surface of the photoelectric conversion part 2 as shown in FIG. 2, or may be provided on only a part of the light acceptance surface of the photoelectric conversion part 2 as shown in FIGS. 11 and 13.

The first electrode 4 may be formed of a transparent conductive film made of ITO or $SnO_2$, or may be formed of a finger electrode made of a metal such as Ag or Au.

Hereinafter, a description will be made of the case where the first electrode 4 is formed of the transparent conductive film.

The transparent conductive film is used to easily connect the light acceptance surface of the photoelectric conversion part 2 to the second gas generation part 7.

Any material used as a transparent electrode in general can be used. More specifically, the transparent electrode may be made of In—Zn—O (IZO), In—Sn—O (ITO), ZnO—Al, Zn—Sn—O or $SnO_2$. In addition, the transparent conductive film preferably has a sunlight transmittance of 85% or more, more preferably 90% or more, and most preferably 92% or more. In this case, the photoelectric conversion part 2 can efficiently absorb light.

The transparent conductive film may be formed in a well-known method such as the sputtering method, the vacuum deposition method, the sol-gel method, the cluster beam deposition method, or the PLD (Pulse Laser Deposition) method.

4. Photoelectric Conversion Part

The photoelectric conversion part 2 has the light acceptance surface and the back surface, and the first gas generation part 8 and the second gas generation part 7 can be provided in tandem on the back surface of the photoelectric conversion part 2. The light acceptance surface receives the light to be photoelectrically converted, and the back surface is provided on the back of the light acceptance surface. The photoelectric conversion part 2 can be provided on the substrate 1 via the first electrode 4 with the light acceptance surface facing downward.

While the shape of the photoelectric conversion part 2 is not limited in particular, it may be substantially rectangle. When the photoelectric conversion part 2 is substantially rectangle, the first gas generation part 8 having a given width and the second gas generation part 7 having a given width can be arranged in tandem so that they are parallel with the one side of the photoelectric conversion part. In this case, the width of the photoelectric conversion part 2 in direction of arranging the first gas generation part 8 and the second gas generation part 7 is, for example, no less than 50 cm and no more than 200 cm. Thus, the size of the hydrogen production device can be increased, and the hydrogen generation amount can be increased. Further, the width of the photoelectric conversion part 2 in perpendicular to the direction of arranging the first gas generation part 8 and the second gas generation part 7 is, for example, no less than 50 cm and no more than 200 cm.

While the photoelectric conversion part 2 is not limited in particular as long as it can separate a charge by the incident light and generate the electromotive force, the photoelectric conversion part 2 may be a photoelectric conversion part using a silicon base semiconductor, a photoelectric conversion part using a compound semiconductor, a photoelectric conversion part using a dye sensitizer, or a photoelectric conversion part using an organic thin film.

The photoelectric conversion part 2 may generate the electromotive force between the light acceptance surface and the back surface. In addition, the photoelectric conversion part 2 may generate the electromotive force between two different areas on one side of the photoelectric conversion part, as shown in FIGS. 14-18. The photoelectric conversion part 2 can be formed by a semiconductor substrate or the like including an n-type semiconductor region and a p-type semiconductor region, for example, as shown in FIGS. 14-18.

The photoelectric conversion part 2 has to be made of a material which generates the electromotive force required for generating hydrogen and oxygen in the hydrogen generation part and the oxygen generation part, respectively, by receiving light. A potential difference between the hydrogen generation part and the oxygen generation part needs to be more than a theoretic voltage (1.23 V) required for water decomposition, so that it is necessary to generate the sufficiently large potential difference in the photoelectric conversion part 2. Therefore, the photoelectric conversion part 2 is preferably provided such that the part to generate the electromotive force is formed of two or more junctions such as pn junctions connected in series.

Materials for the photoelectric conversion include materials provided based on a silicon base semiconductor, a compound semiconductor, and an organic material, and any photoelectric conversion material can be used. In addition, in order to increase the electromotive force, the above photoelectric conversion materials may be laminated. When photoelectric conversion materials are laminated, a multi junction structure may be made of the same material. In a case where the plurality of photoelectric conversion layers having different optical bandgaps are laminated to complement low-sensitive wavelength regions of the photoelectric conversion layers to each other, the incident light can be efficiently absorbed over a large wavelength region. Preferably, each of the plurality of photoelectric conversion layers has different bandgaps. According to the above configuration, the more electromotive force can be generated in the photoelectric conversion part, so that the electrolytic solution can be more efficiently electrolyzed.

In addition, in order to improve series connection characteristics among the photoelectric conversion layers, and in order to match photocurrents generated in the photoelectric conversion part 2, a conductor such as a transparent conductive film may be interposed between the layers. Thus, the photoelectric conversion part 2 can be prevented from deteriorating.

The photoelectric conversion part 2 may be formed by connecting arranged photoelectric conversion layers 35 in series with a third conductive part 33, as shown in FIGS. 11, 13, 15, 17, and 18. In addition, when the electromotive force is generated between the side of the light acceptance surface and the side of the backside of the photoelectric conversion layers 35, a third conductive part 33 can be formed by electrically connecting a translucent electrode 30 provided on the side of the light acceptance surface of the photoelectric conversion layers 35 to a backside electrode 31 provided on the side of the back surface of the photoelectric conversion layers 35, as shown in FIGS. 11 and 13. It is noted that the translucent electrode 30 can be formed by the similar way as the first electrode 4. Additionally, the first electrode 4 and the translucent electrode 3 can be formed simultaneously by forming a translucent conductive film on the substrate 1 with CVD method or sputtering, and then laser scribing the translucent conductive film. The backside electrode 31 can be formed by the similar way as the second electrode 5. In addition, the method for electrically connecting the translucent electrode 30 to the backside electrode 31 may be a method for forming a contact hole in the photoelectric conversion layers 35, or a method for forming a part of the backside electrode 31 on a part of the translucent electrode 30.

Figure 15:
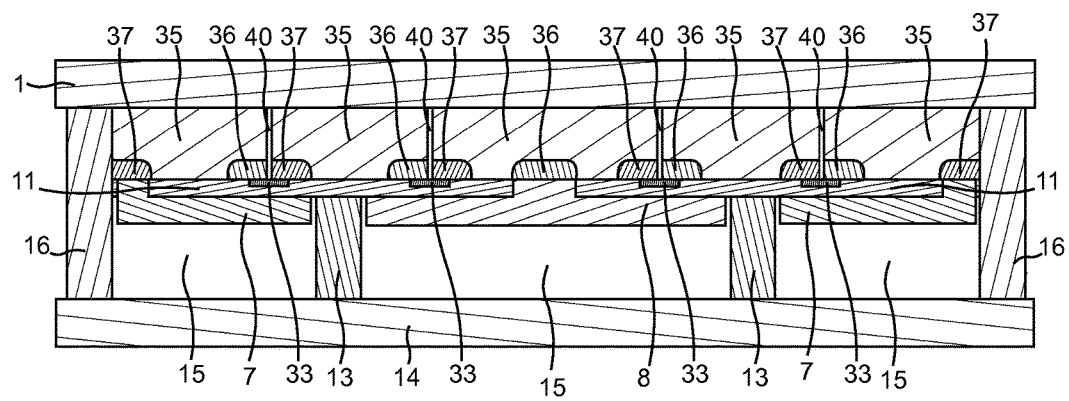
FIG. 15 is a schematic cross-sectional view showing a configuration of a hydrogen production device according to an embodiment of the present invention.
Figure 17:
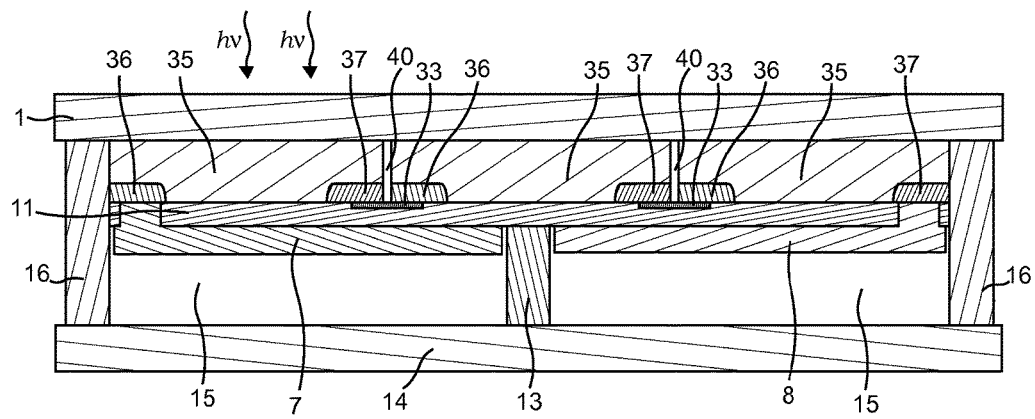
FIG. 17 is a schematic cross-sectional view showing a configuration of a hydrogen production device according to a reference embodiment of the present invention.
Figure 18:
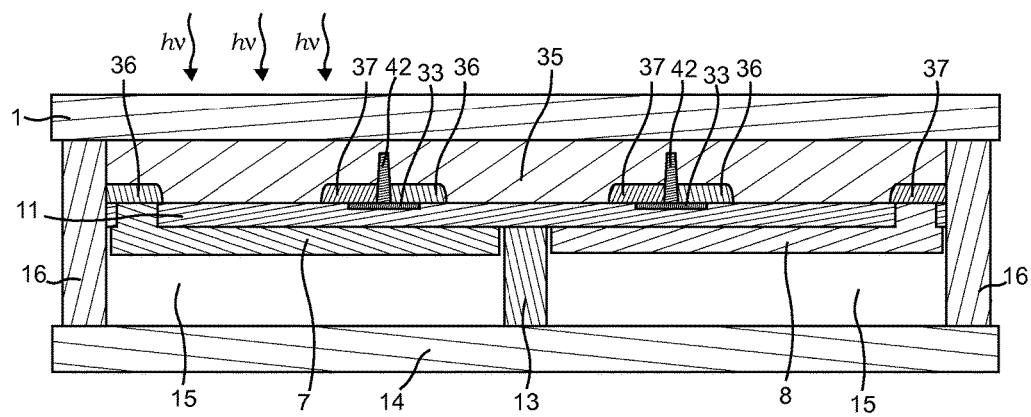
FIG. 18 is a schematic cross-sectional view showing a configuration of a hydrogen production device according to a reference embodiment of the present invention.

Further, when the electromotive force is generated between different areas on the side of the back surface of the photoelectric conversion layers 35, the third conductive part 33 can be formed as shown in FIGS. 15, 17, and 18.

Hereinafter, examples of the photoelectric conversion part 2 will be described more specifically. It is noted that the photoelectric conversion part 2 may be provided by combining these examples. Also, the photoelectric conversion part 2 as described below may be the photoelectric conversion layer 35 as long as there is no inconsistency.

4-1. Photoelectric Conversion Part Using Silicon Base Semiconductor

The photoelectric conversion part 2 using the silicon base semiconductor may be of a monocrystalline type, a polycrystalline type, an amorphous type, a spherical silicon type, or a combination of those. A pn junction between a p-type semiconductor and an n-type semiconductor can be provided in any one of these types. Alternatively, a pin junction in which an i-type semiconductor is provided between the p-type semiconductor and the n-type semiconductor can be provided. Further alternatively, a plurality of pn junctions, a plurality of pin junctions, or the pn junction and pin junction may be provided.

The silicon base semiconductor is the semiconductor containing silicon series such as silicon, silicon carbide, or silicon germanium. In addition, it may include the one in which an n-type impurity or a p-type impurity is added to silicon, and may include a crystalline, amorphous, or microcrystalline semiconductor.

Alternatively, the photoelectric conversion part 2 using the silicon base semiconductor may be a thin-film or thick-film photoelectric conversion layer formed on the substrate 1, the one in which the pn junction or the pin junction is formed on a wafer such as a silicon wafer, or the one in which the thin-film photoelectric conversion layer is formed on a wafer having the pn junction or the pin junction.

An example of a method for forming the photoelectric conversion part 2 using the silicon base semiconductor is shown below.

A first conductivity type semiconductor layer is formed on the first electrode 4 laminated on the substrate 1 by a method such as a plasma CVD method. This first conductivity type semiconductor layer is a p+-type or n+-type amorphous Si thin film, or a polycrystalline or microcrystalline Si thin film doped such that an impurity atom concentration is $1 \times 10^{18}$ to $5 \times 10^{21}/cm^3$. The material for the first conductivity type semiconductor layer is not limited to Si, and a compound such as SiC, SiGe, or $Si_xO_{1-x}$ may be used.

A polycrystalline or microcrystalline Si thin film is formed as a crystalline Si base photoactive layer, on the first conductivity type semiconductor layer formed as described above by a method such as the plasma CVD method. In this case, the conductivity type is the first conductivity type whose doping concentration is lower than that of the first conductivity type semiconductor layer, or an i type. The material for the crystalline Si base photoactive layer is not limited to Si, and a compound such as SiC, SiGe, or $Si_xO_{1-x}$ may be used.

Then, in order to form a semiconductor junction on the crystalline Si base photoactive layer, a second conductivity type semiconductor layer whose conductivity type is opposite to that of the first conductivity type semiconductor layer is formed by a method such as the plasma CVD method. This second conductivity type semiconductor layer is an n+-type or p+-type amorphous Si thin film, or a polycrystalline or microcrystalline Si thin film doped with an impurity atom with $1 \times 10^{18}$ to $5 \times 10^{21}/cm^3$. The material for the first conductivity type semiconductor layer is not limited to Si, and a compound such as SiC, SiGe, or $Si_xO_{2-x}$ may be used. In addition, in order to further improve the junction characteristics, a substantially i-type amorphous Si base thin film can be inserted between the crystalline Si base photoactive layer and the second conductivity type semiconductor layer. Thus, it is possible to laminate the photoelectric conversion layer which is closest to the light acceptance surface.

Then, a second photoelectric conversion layer is formed. The second photoelectric conversion layer is formed of a first conductivity type semiconductor layer, a crystalline Si base photoactive layer, and a second conductivity type semiconductor layer, and they are formed in the same manners correspondingly as the first conductivity type semiconductor layer, the crystalline Si base photoactive layer, and the second conductivity type semiconductor layer in the first photoelectric conversion layer. When the potential required for water decomposition cannot be sufficiently obtained with the two-layer tandem, it is preferable to provide three-layer or more laminated structure. Here, it is to be noted that a crystallization volume fraction of the crystalline Si base photoactive layer in the second photoelectric active layer is preferably higher than that of the crystalline Si base photoactive layer in the first layer. Similarly, when the three or more layers are laminated, its crystallization volume fraction is preferably higher than that of the lower layer. This is because absorption is high in a long-wavelength region, and spectral sensitivity is shifted to the long-wavelength region side, so that sensitivity can be improved over a large wavelength region even when the photoactive layer is made of the same Si material. That is, when the tandem structure is made of Si having different crystallinities, the spectral sensitivity becomes high, so that the light can be used with high efficiency. At this time, the material having a low crystallinity has to be provided on the side of the light acceptance surface to implement high light use efficiency. In addition, when the crystallinity is 40% or less, an amorphous component increases, and deterioration is generated. In this embodiment, while the photoelectric conversion part 2 composed of each photoelectric conversion layers that connects in series by laminating the photoelectric conversion layer is described, the photoelectric conversion part 2 can be also formed by connecting photoelectric conversion layers provided to arrange as shown in FIGS. 11 and 13 in series.

Then, examples for forming the photoelectric conversion part 2 using a silicon substrate will be described as follows.

The silicon substrate may be a monocrystalline silicon substrate, or polycrystalline silicon substrate, and may be a p-type, an n-type, or an i-type. The n-type semiconductor region 37 can be formed by doping a part of the silicon substrate with a n-type impurity such as P by thermal diffusion, ion implantation or the like, and the p-type semiconductor region 36 can be formed by doping the other part of the silicon substrate with a p-type impurity such as B by thermal diffusion, ion implantation or the like. Thus, a pn junction, a pin junction, an npp+ junction, or a pnn+ junction can be formed in the silicon substrate, and the photoelectric conversion part 2 can be formed thereby.

Figure 14:
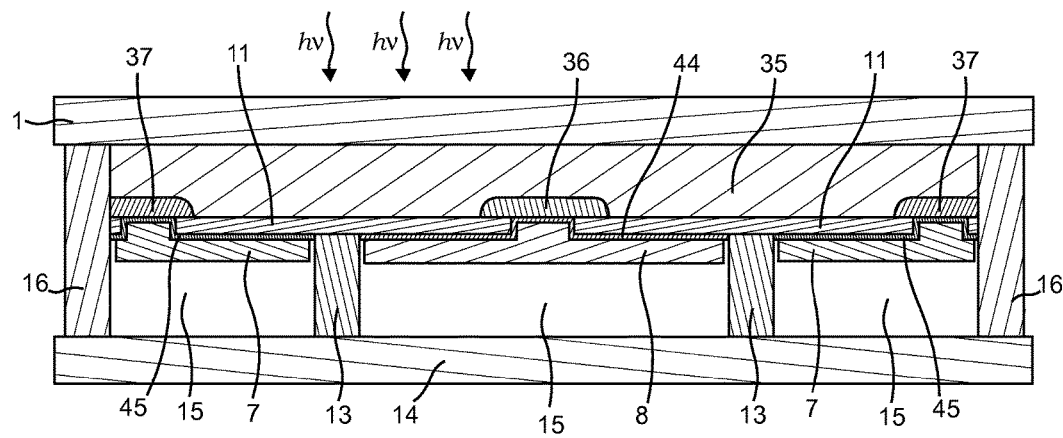
FIG. 14 is a schematic cross-sectional view showing a configuration of a hydrogen production device according to an embodiment of the present invention.
Figure 16:
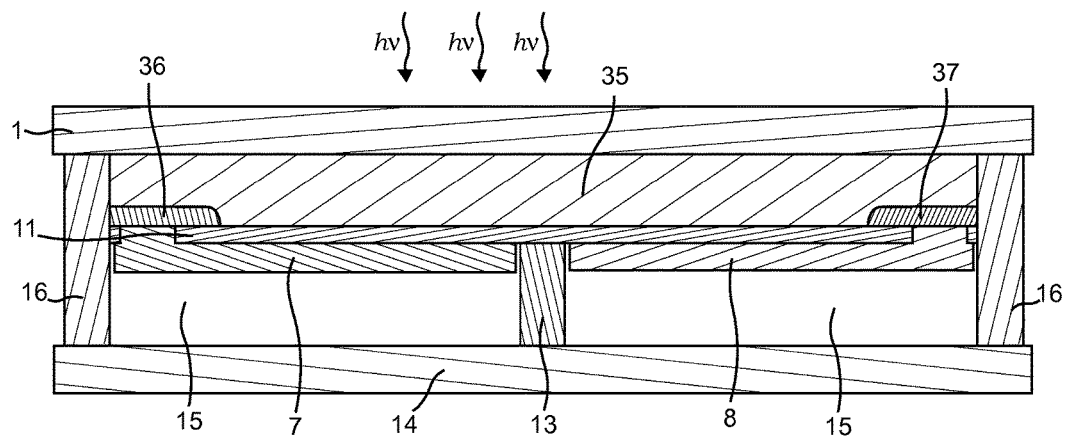
FIG. 16 is a schematic cross-sectional view showing a configuration of a hydrogen production device according to a reference embodiment of the present invention.

As shown in FIG. 16, one n-type semiconductor region 37 and one p-type semiconductor region 36 can be each formed in the silicon substrate, or either a plurality of the n-type semiconductor region 37 or a plurality of the p-type semiconductor region 36 can be formed, as shown in FIGS. 14 and 15. In addition, the photoelectric conversion part 2 can be formed by setting to arrange silicon substrates forming the n-type semiconductor region 37 and the p-type semiconductor region 36, and connecting the silicon substrates by a third conductive part 33, as shown in FIGS. 15 and 17. In addition, the photoelectric conversion part 2 can be formed by forming a trench isolation 42 on one silicon substrate, and forming the n-type semiconductor region 37 and the p-type semiconductor region 36 respectively in each area separated by the trench isolation 42, as shown in FIG. 18.

In this embodiment, while using silicon substrate is described, other semiconductor substrate being capable of forming the pn junction, the pin junction, the npp$^+$ junction, or the pnn$^+$ junction may be used. The photoelectric conversion part is not limited to the semiconductor substrate as long as the n-type semiconductor region 37 and the p-type semiconductor region 36 are formed thereon, or may be a semiconductor layer formed on a substrate.

4.2 Photoelectric Conversion Part Using Compound Semiconductor

As for the photoelectric conversion part using the compound semiconductor, for example, a pn junction is formed using GaP, GaAs, InP, or InAs formed of III-V group elements, CdTe/CdS formed of II-VI group elements, or CIGS (Copper Indium Gallium DiSelenide) formed of I-III-VI group elements.

A method for producing the photoelectric conversion part using the compound semiconductor is shown below as one example, and in this method, film forming processes and the like are all sequentially performed with an MOCVD (Metal Organic Chemical Vapor Deposition) device. As a material for the III group element, an organic metal such as trimethylgallium, trimethylaluminum, or trimethylindium is supplied to a growth system using hydrogen as a carrier gas. As a material for the V group element, a gas such as arsine (AsH$_3$), phosphine (PH$_3$), or stibine (SbH$_3$) is used. As a p-type impurity or n-type impurity dopant, diethylzinc or the like is used to make the p type, or silane (SiH$_4$), disilane (Si$_2$H$_6$), hydrogen selenide (H$_2$Se), or the like is used to make the n type. When the above raw material gas is supplied onto the substrate heated to 700° C. and pyrolyzed, a desired compound semiconductor material film can be epitaxially grown. A composition of the grown layer can be controlled by an introduced gas composition, and a film thickness thereof can be controlled by an introduction time length of the gas. When the photoelectric conversion part is provided as the multi junction laminated layers, the grown layers can be excellent in crystalline property by matching lattice constants between the layers as much as possible, so that photoelectric conversion efficiency can be improved.

In order to enhance carrier collection efficiency, a well-known window layer may be provided on the side of the light acceptance surface or a well-known electric field layer may be provided on the side of a non-light acceptance surface, in addition to the part in which the pn junction is formed. In addition, a buffer layer may be provided to prevent the impurity from being diffused.

4-3. Photoelectric Conversion Part Using Dye Sensitizer

The photoelectric conversion part using the dye sensitizer is mainly formed of a porous semiconductor, a dye sensitizer, an electrolyte, and a solvent, for example.

As a material for the porous semiconductor, one kind or more can be selected from well-known semiconductors made of titanium oxide, tungsten oxide, zinc oxide, barium titanate, strontium titanate, cadmium sulfide, and the like. Methods for forming the porous semiconductor on the substrate include a method in which a paste containing semiconductor particles is applied by a method such as a screen printing method or an ink jet method and is dried or baked, a method in which a film is formed by a method such as the CVD method using a raw material gas, a PVD method, a deposition method, a sputtering method, a sol-gel method, and a method using an electrochemical redox reaction.

As the dye sensitizer which is adsorbed to the porous semiconductor, various kinds of dyes which are absorbed to a visible light region and an infrared light region can be used. Here, in order to strongly adsorb the dye to the porous semiconductor, it is preferable that a dye molecule contains a group such as a carboxylic acid group, a carboxylic acid anhydride group, an alkoxy group, a sulfonic acid group, a hydroxyl group, a hydroxylalkyl group, an ester group, a mercapto group, or a phosphonyl group. These functional groups provide electric coupling to easily move an electron between an excited state dye and a conduction band of the porous semiconductor.

Dyes containing the functional groups include a ruthenium bipyridine series dye, quinone series dye, quinoneimine series dye, azo series dye, quinacridone series dye, squarylium series dye, cyanine series dye, merocyanine series dye, triphenylmethane series dye, xanthine series dye, porphyrin series dye, phthalocyanine series dye, perylene series dye, indigo series dye, and naphthalocyanine series dye.

Methods for adsorbing the dye to the porous semiconductor include a method in which the porous semiconductor is dipped in a solution including the dye dissolved therein (dye adsorbing solution). The solvents used in the dye adsorbing solution are not limited in particular as long as they can dissolve the dye, and more specifically include alcohol such as ethanol or methanol, ketone such as acetone, ether such as diethylether or tetrahydrofuran, a nitrogen compound such as acetonitrile, aliphatic hydrocarbon such as hexane, aromatic hydrocarbon such as benzene, ester such as ethyl acetate, and water.

The electrolyte is formed of a redox pair, and a liquid or a solid medium such as a polymer gel for holding the redox pair.

As the redox pair, a metal such as iron series or cobalt series, or a halogen substance such as chlorine, bromine, or iodine is preferably used, and a combination of metallic iodide such as lithium iodine, sodium iodine, or potassium iodine, and iodine is preferably used. Furthermore, an imidazole salt such as dimethyl-propyl-imidazole-iodide may be mixed therein.

As the solvent, while a carbonate compound such as propylene carbonate, a nitrile compound such as acetonitrile, alcohol such as ethanol or methanol, water, a polar aprotic substance, or the like is used, among them, the carbonate compound or the nitrile compound is preferably used.

4-4. Photoelectric Conversion Part Using Organic Thin Film

The photoelectric conversion part using the organic thin film may be an electron hole transport layer formed of an organic semiconductor material having an electron-donating property and an electron-accepting property, or lamination of an electron transport layer having the electron-accepting property and a hole transport layer having the electron-donating property.

While the organic semiconductor material having the electron-donating property is not limited in particular as long as it has a function as an electron donor, it is preferable that a film can be formed by a coating method, and especially, a conductive polymer having the electron-donating property is preferably used.

Here, the conductive polymer means a □-conjugated polymer formed of a □-conjugated system in which a double bond or triple bond containing carbon-carbon or a heteroatom is adjacent to a single bond alternately, while showing a semiconducting property.

The material for the conductive polymer having the electron-donating property may be polyphenylene, polyphenylenevinylene, polythiophene, polycarbazole, polyvinyl carbazole, polysilane, polyacetylene, polypyrrole, polyaniline, polyfluorene, polyvinyl pyrene, polyvinyl anthracene, a derivative or a copolymer thereof, a phthalocyanine-containing polymer, a carbazole-containing polymer, an organometallic polymer, or the like. Especially, a preferably used material may be thiophene-fluorene copolymer, polyalkyl thiophene, phenyleneethynylene-phenylenevinylene copolymer, fluorine-phenylene vinylene copolymer, thiophene-phenylenevinylene copolymer, or the like.

While the material for the organic semiconductor having the electron-accepting property is not limited in particular as long as it has a function as an electron acceptor, it is preferable that a film can be formed by a coating method and especially, a conductive polymer having the electron-donating property is preferably used.

As the conductive polymers having the electron-accepting property, it may be polyphenylenevinylene, polyfluorene, a derivative or a copolymer thereof, carbon nanotube, fullerene, a derivative thereof, a polymer containing a CN group or a $CF_3$ group, and a $CF_3$-substituted polymer thereof.

Alternatively, an organic semiconductor material having the electron-accepting property doped with an electron donating compound, or an organic semiconductor material having the electron-donating property doped with an electron accepting compound may be used. A material for the conductive polymer having the electron-accepting property doped with the electron donating compound may be the above-described conductive polymer material having the electron-accepting property. The electron donating compound to be doped may be a Lewis base such as an alkali metal or an alkali earth metal such as Li, K, Ca, or Cs. The Lewis base acts as the electron donor. In addition, the material for the conductive polymer having the electron-donating property doped with the electron accepting compound may be the above-described conductive polymer material having the electron-donating property. The electron accepting compound to be doped may be a Lewis acid such as $FeCl_3$, $AlCl_3$, $AlBr_3$, $AsF_6$, or a halogen compound. The Lewis acid acts as the electron acceptor.

While it is primarily assumed that the above photoelectric conversion part 2 receives sunlight and performs the photoelectric conversion, it can be irradiated, depending on applications, with artificial light such as light emitted from a fluorescent lamp, an incandescent lamp, an LED, or a specific heat source to perform the photoelectric conversion.

5. Second Electrode

The second electrode 5 can be provided between the photoelectric conversion part 2 and the first gas generation part 8. By providing the second electrode 5, the potential of the back surface of the photoelectric conversion part 2 can be almost the same as the potential of the first gas generation part 8. In addition, an ohmic loss between the back surface of the photoelectric conversion part 2 and the first gas generation part 8 can be reduced. In addition, a large current can flow between the back surface of the photoelectric conversion part 2 and the first gas generation part 8. Thus, hydrogen or oxygen can be efficiently generated by the electromotive force generated in the photoelectric conversion part 2. When the backside of the photoelectric conversion part 2 can be in contact with the first gas generation part 8 so that the resistance between them becomes small, the second electrode 5 may be omitted. Further, the second electrode 5 preferably has a corrosion resistance and liquid-blocking properties to an electrolytic solution. Thus, the photoelectric conversion part 2 can be prevented from corroding with the electrolytic solution.

While the second electrode 5 is not limited in particular as long as it has conductivity, it may be a metal thin film, such as a thin film made of Al, Ag, or Au. The film can be formed by a sputtering method or the like. Alternatively, it may be a transparent conductive film made of a material such as In—Zn—O (IZO), In—Sn—O (ITO), ZnO—Al, Zn—Sn—O, or $SnO_2$.

6. Insulation Part

The insulation part 11 can be provided between the back surface of the photoelectric conversion part 2 and the second gas generation part 7. In addition, the insulation part 11 can be provided between the first gas generation part 8 and the second gas generation part 7. Furthermore, the insulation part 11 may be provided between the first conductive part 9 and the photoelectric conversion part 2, between the second conductive part 10 and the photoelectric conversion part 2, and between the second conductive part 10 and the second electrode 5.

By providing the insulation part 11, a current can flow between the light acceptance surface of the photoelectric conversion part 2 and the second gas generation part 7, and a current can flow between the back surface of the photoelectric conversion part 2 and the first gas generation part 8 by the electromotive force generated in the photoelectric conversion part 2. In addition, a leak current can be smaller. Thus, the potential of the light acceptance surface of the photoelectric conversion part 2 can be almost the same as the potential of the second gas generation part 7, and the potential of the back surface of the photoelectric conversion part 2 can be almost the same as the potential of the first gas generation part 8, so that hydrogen and oxygen can be more efficiently generated.

In addition, the insulation part 11 can be formed so as to cover the side of the photoelectric conversion part 2, as shown in FIGS. 10-13. Thus, the second gas generation part 7 can be formed on the insulation part 11 that covers the side of the photoelectric conversion part 2, even if the second gas generation part is provided to be in contact with the first electrode 4, a leak current can be prevented from generating between them. In addition, the insulation part 11 can be formed between each photoelectric conversion layers 28, as shown in FIGS. 11 and 13. Thus, a leak current is prevented from flowing between them.

Further, when the electromotive force is generated between different areas on the back surface of the photoelectric conversion part 2, the insulation part 11 can be provided between the first and the second gas generation parts 8, 7 and the backside of the photoelectric conversion part 2, and the insulation part 11 can have an opening to electrically connect the first gas generation part 8 to a part of the backside of the photoelectric conversion part 2, and an opening to electrically connect the second gas generation part 7 to a part of the backside of the photoelectric conversion part 2, as shown in FIGS. 14-18.

In addition, a fifth conductive part 44 can be provided between the insulation part 11 and the first gas generation part 8. In addition, a fourth conductive part 45 can be provided between the insulation part 11 and the second gas generation part 7. Thus, internal resistance can be reduced. For example, the fifth conductive part 44 and the fourth conductive part 45 can be provided as shown in FIGS. 11 and 14.

In addition, it is preferable that the insulation part 11 has a corrosion resistance and liquid-blocking properties to an electrolytic solution. Thus, the photoelectric conversion part 2 can be prevented from corroding with the electrolytic solution.

The insulation part 11 can be made of either an organic material or an inorganic material, and the organic material may be an organic polymer such as polyamide, polyimide, polyarylene, an aromatic vinyl compound, a fluorine series polymer, an acrylic series polymer, or a vinyl amide series polymer, while the inorganic material may be a metal oxide such as $Al_2O_3$, $SiO_2$ such as a porous silica film, a fluoridated silicon oxide film (FSG), SiOC, an HSQ (Hydrogen Silsesquioxane) film, $SiN_X$, or silanol ($Si(OH)_4$), which is dissolved in the solvent such as alcohol to be applied and heated to form a film.

A method for forming the insulation part 11 may be a method in which a paste containing an insulation material is applied by a screen printing method, inkjet method, or spin coating method and then dried or baked, a method in which a film is formed by a method such as the CVD method using a raw material gas, PVD method, deposition method, sputtering method, or sol-gel method.

7. Second Conductive Part

The second conductive part 10 can be provided so as to be in contact with each of the first electrode 4 and the second gas generation part 7. By providing the second conductive part 10, the first electrode 4 being in contact with the light acceptance surface of the photoelectric conversion part 2 can be electrically connected to the second gas generation part 7 with ease.

The second conductive part 10 is in contact with the first electrode 4 which is in contact with the light acceptance surface of the photoelectric conversion part 2 and the second gas generation part 7 provided on the back surface of the photoelectric conversion part 2, so that when the cross-sectional area of the second conductive part 10 which is parallel with the light acceptance surface of the photoelectric conversion part 2 is too large, an area of the light acceptance surface of the photoelectric conversion part 2 becomes small. Meanwhile, when the cross-sectional area of the second conductive part 10 which is parallel with the light acceptance surface of the photoelectric conversion part 2 is too small, a difference is generated between the potential of the light acceptance surface of the photoelectric conversion part 2 and the potential of the second gas generation part 7, so that the potential difference required for electrolyzing the electrolytic solution could not be provided and generation efficiency of hydrogen or oxygen could be lowered. Therefore, the cross-sectional area of the second conductive part which is parallel to the light acceptance surface of the photoelectric conversion part 2 needs to be set within a certain range. For example, the cross-sectional area of the second conductive part which is parallel to the light acceptance surface of the photoelectric conversion part 2 (when the plurality of second conductive parts are provided, their total) may be 0.1% or more to 10% or less, preferably 0.5% or more to 8% or less, and more preferably 1% or more to 6% or less when it is assumed that the area of the light acceptance surface of the photoelectric conversion part 2 is 100%.

In addition, the second conductive part 10 may be provided in a contact hole which penetrates the photoelectric conversion part 2. In this case, the decrease in area of the light acceptance surface of the photoelectric conversion part 2 because of the presence of the second conductive part 10 can be smaller. In addition, in this case, a current path between the light acceptance surface of the photoelectric conversion part 2 and the second gas generation part 7 can be short, so that hydrogen or oxygen can be generated more efficiently. In addition, in this case, the cross-sectional area of the second conductive part 10 which is parallel to the light acceptance surface of the photoelectric conversion part 2 can be easily adjusted.

Furthermore, the number of the contact hole provided with the second conductive part 10 may be one or more, and the contact hole may have a circular cross-section. In addition, when the cross-sectional area of the contact hole which is parallel to the light acceptance surface of the photoelectric conversion part 2 (when the plurality of contact holes are provided, their total) may be 0.1% or more to 10% or less, preferably 0.5% or more to 8% or less, and more preferably 1% or more to 6% or less when it is assumed that the area of the light acceptance surface of the photoelectric conversion part 2 is 100%. According to the above configuration, the area of the light acceptance surface of the photoelectric conversion part is suppressed from being reduced due to the presence of the second conductive part.

Figure 4:
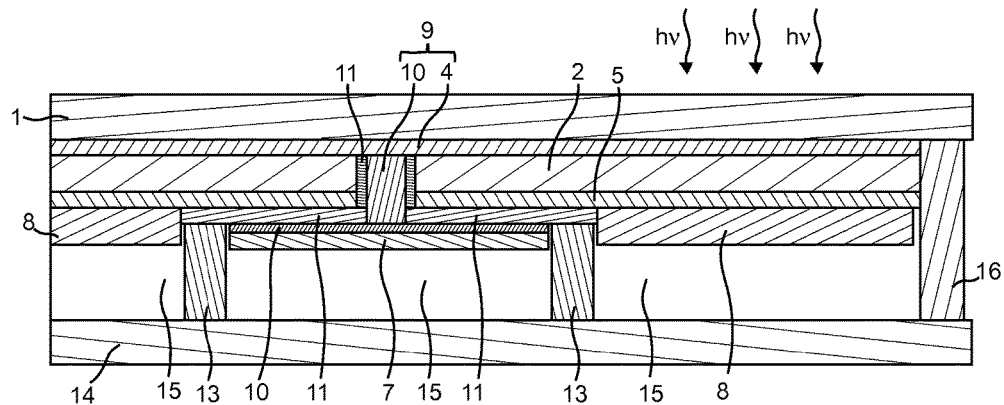
FIG. 4 is a schematic cross-sectional view showing a configuration of a hydrogen production device according to an embodiment of the present invention.

In addition, the second conductive part 10 may be formed of a part provided in a contact hole which penetrates the photoelectric conversion part 2 and a part provided between the second gas generation part 7 and the insulation part 11, as shown in FIG. 4. Thus, the second gas generation part 7 is electrically connected to the second conductive part 10 adequately, and a potential of the light acceptance surface of the photoelectric conversion part 2 can be almost the same as a potential of the second gas generation part 7. In addition, a low conductivity catalyst can be used as the second gas generation part 7.

In addition, the second conductive part 10 may be provided at the area where the photoelectric conversion part 2 is not formed.

Further, the second conductive part 10 may be provided so as to cover the side of the photoelectric conversion part 2.

A material for the second conductive part 10 is not limited in particular as long as it has conductivity. Methods include a method in which a paste containing conductive particles such as carbon paste or Ag paste is applied by a screen printing method, or inkjet method and then dried or baked, a method in which a film is formed by a method such as the CVD method using a raw material gas, PVD method, deposition method, sputtering method, sol-gel method, and method using electrochemical redox reaction.

Figure 5:
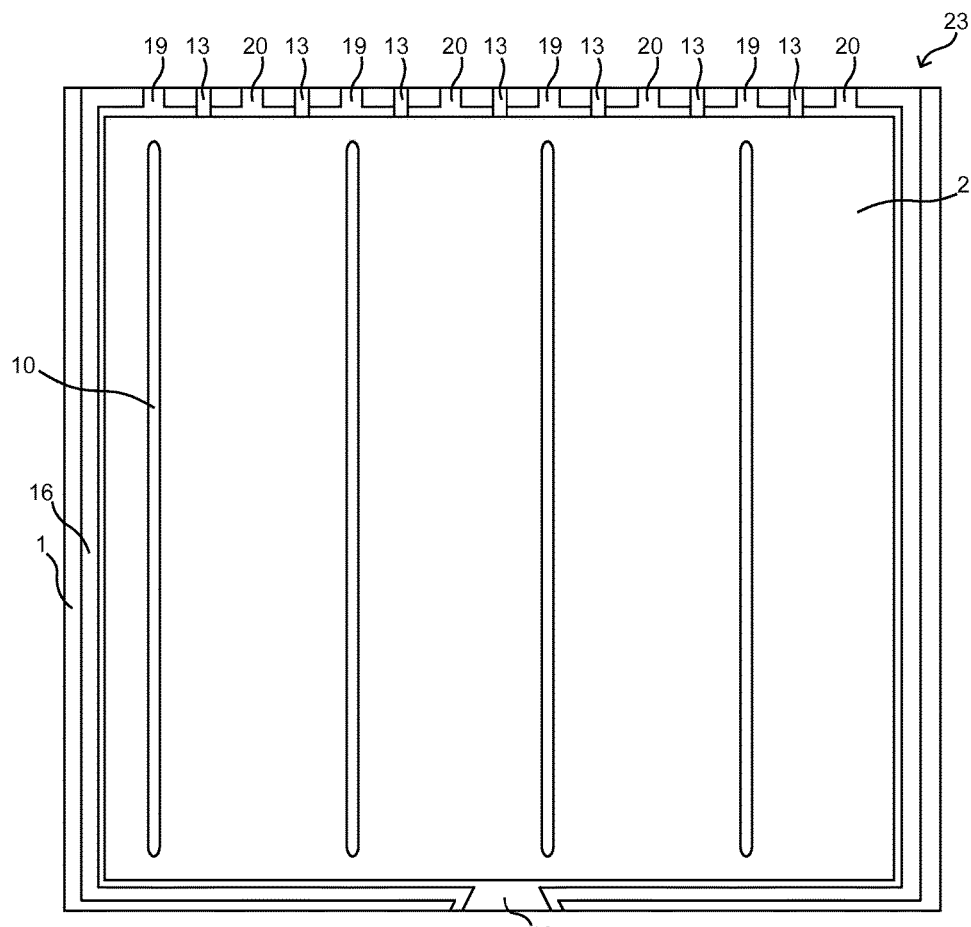
FIG. 5 is a schematic plan view showing a configuration of a hydrogen production device according to an embodiment of the present invention.

FIG. 5 is a view of a hydrogen production device according one embodiment of the present invention taken from the side of a light acceptance surface. The cross section of the second conductive part 10 which is parallel to the light acceptance surface of the photoelectric conversion part 2 may be circular as shown in FIG. 1 or may have a long and thin shape as shown in FIG. 4. In addition, the number of the second conductive part 10 may be plural whereas that of the second gas generation part 7 may be one, as shown in FIG. 1, or the number of the second conductive part 10 may be one whereas that of the second gas generation part 7 may be one, as shown in FIG. 5. In addition, the second conductive part 10 provided in the contact hole to electrically connect the light acceptance surface of the photoelectric conversion part 2 to the second gas generation part 7 may form a long shape which is substantially parallel to the partition wall 13. In addition, the second conductive part 10 provided in the contact hole may have a cross-section which is parallel to the light acceptance surface of the photoelectric conversion part 2, and the cross-section may have a shape which is parallel with the array direction of the first gas generation part and the second gas generation part.

8. First Gas Generation Part

The first gas generation part 8 is provided on the back surface of the photoelectric conversion part 2. Thus, the first gas generation part 8 does not block the light entering the photoelectric conversion part 2. In addition, the first gas generation part 8 is either the hydrogen generation part or the oxygen generation part, and can be electrically connected to the backside of the photoelectric conversion part 2. The fifth conductive part 44 can be provided between the photoelectric conversion part 2 and the first gas generation part 8 in order to transport electrons between the photoelectric conversion part 2 and the first gas generation part 8 efficiently. Thus, the potential of the back surface of the photoelectric conversion part 2 can be almost the same as the potential of the first gas generation part 8, so that hydrogen or oxygen can be generated by the electromotive force generated in the photoelectric conversion part 2. In addition, the first gas generation part 8 is plural, and can be provided so that the first gas generation part 8 and the second gas generation part 7 arrange alternately and in parallel. Thus, boundary surface of the first gas generation part 8 and the second gas generation part 7 can be increased, and the distance between an electrolytic solution around the first gas generation part 8 and an electrolytic solution around the second gas generation part 7 can be shortened. In addition, a proton can move easily so as to eliminate a proton concentration imbalance between the electrolytic solution around the first gas generation part 8 and the electrolytic solution around the second gas generation part 7. Thus, reduction in the hydrogen generation rate due to the imbalance in the proton concentration can be prevented.

In addition, the first gas generation part 8 can be provided so as not to be in contact with the second gas generation part 7. Thus, a leak current is prevented from flowing between the first gas generation part 8 and the second gas generation part 7. Furthermore, the first gas generation part 8 may be exposed to the electrolytic solution path 15. Thus, $H_2$ or $O_2$ can be generated from the electrolytic solution on the surface of the first gas generation part 8.

9. Second Gas Generation Part

The second gas generation part 7 is provided on the back surface of the photoelectric conversion part 2. In this case, the second gas generation part 7 does not block the light entering the photoelectric conversion part 2. In addition, the second gas generation part 7 is either the hydrogen generation part or the oxygen generation part, and can be electrically connected to the light acceptance surface of the photoelectric conversion part 2 through the first conductive part 9. Thus, the potential of the light acceptance surface of the photoelectric conversion part 2 can be almost the same as the potential of the second gas generation part 7, so that hydrogen or oxygen can be generated by the electromotive force generated in the photoelectric conversion part 2. The fourth gas generation part 45 can be provided between the photoelectric conversion part 2 and the second gas generation part 7 in order to conduct electrons between the photoelectric conversion part 2 and the second gas generation part 7 efficiently.

As shown in FIGS. 14-18, when the electromotive force is generated between different regions (for example, the p-type semiconductor region 36 and the n-type semiconductor region 37) on the back surface of the photoelectric conversion part 2, the second gas generation part 7 can be electrically connected to the photoelectric conversion part 2 through the back surface of the photoelectric conversion part.

Figure 12:
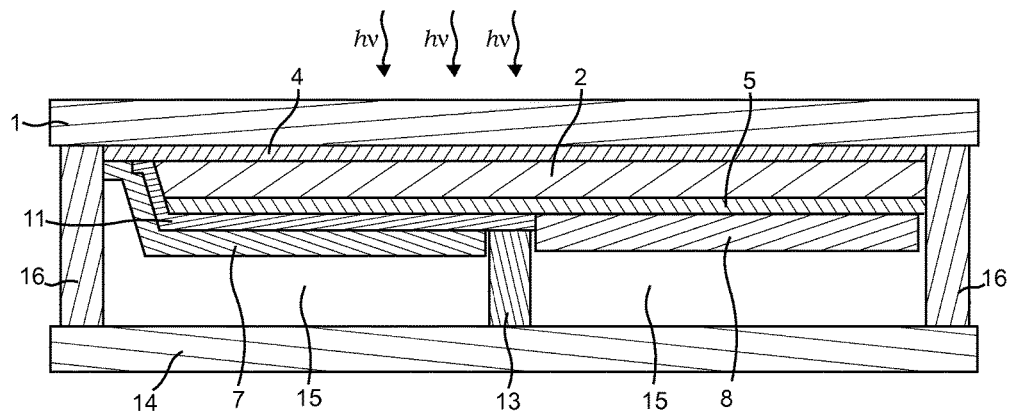
FIG. 12 is a schematic cross-sectional view showing a configuration of a hydrogen production device according to a reference embodiment of the present invention.

In addition, the second gas generation part 7 can also be provided so as to be in contact with the first electrode 4. Thus, a potential of the light acceptance surface of the photoelectric conversion part 2 can be almost the same as a potential of the second gas generation part 7. For example, as shown in FIGS. 10, 12, and 13, the side of the photoelectric conversion part 2 can be covered with the insulation part 11, and then the second gas generation part 7 can be provided so as to cover the side of the photoelectric conversion part 2. Thus, the second gas generation part 7 can be electrically connected to the light acceptance surface of the photoelectric conversion part 2 without forming a contact hole. In addition, as shown in FIG. 11, the second conductive part 10 can be provided between the first electrode 4 and the second gas generation part 7. Thus, internal resistance can be reduced.

In addition, the second gas generation part 7 is plural, and can be provided so as to arrange the first gas generation part 8 alternately and in parallel. Thus, a proton conduction path between the first gas generation part 8 and the second gas generation part 7 can be increased, and reduction in the hydrogen generation rate due to the imbalance in the proton concentration can be prevented. In addition, the second gas generation part 7 can be provided on the back surface side of the photoelectric conversion part 2 via the insulation part 11. In addition, the second gas generation part 7 can be provided so as not to be in contact with the first gas generation part 8. Thus, a leak current is prevented from flowing between them. Furthermore, the second gas generation part 7 may be exposed to the electrolytic solution path 15. Thus, $H_2$ or $O_2$ can be generated from the electrolytic solution on the surface of the second gas generation part 7.

In addition, the first gas generation part 8 and the second gas generation part 7 may be substantially rectangle or strip-shaped. The substantially rectangle or strip-shaped first gas generation part 8 and the substantially rectangle or strip-shaped second gas generation part 7 may be provided to arrange alternately and in parallel. In addition, the partition wall 13 may be provided between the first gas generation part 8 and the second gas generation part 7. Further, the long side of the first gas generation part 8 may be provided to adjoin that of the second gas generation part 7 across the partition wall 13.

Figure 6:
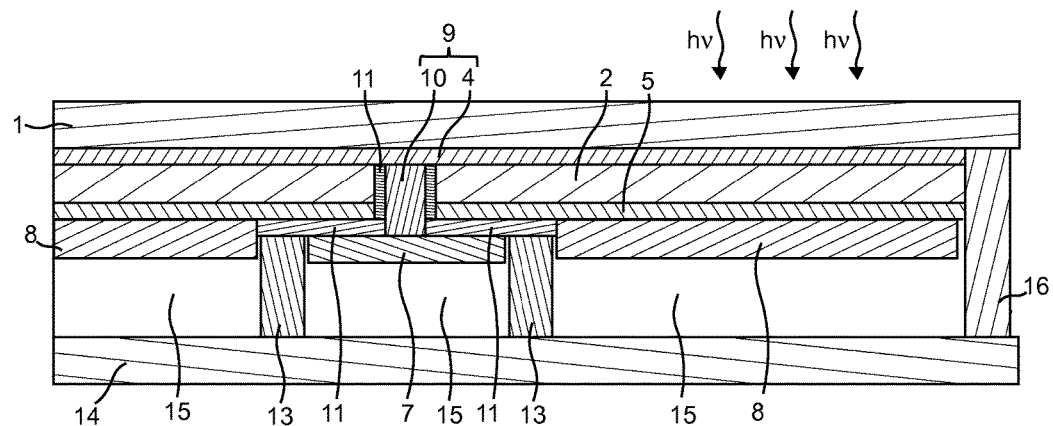
FIG. 6 is a schematic cross-sectional view showing a configuration of a hydrogen production device according to an embodiment of the present invention.

In addition, the width in direction of arranging the first gas generation part 8 and the second gas generation part 7 is not limited in particular, for example, may be the same, or different as shown in FIG. 6. The first gas generation part 8 may have a width of, for example, no less than 5 cm and no more than 20 cm. The second gas generation part 7 may have a width of, for example, no less than 5 cm and no more than 20 cm. According to the above configuration, even if the hydrogen production device becomes larger scale, a distance that a proton is ion-conducted between an electrolytic solution around the first gas generation part and an electrolytic solution around the second gas generation part can be more shortened. As a result, the imbalance in the proton concentration can be decreased, and the hydrogen generation rate can be prevented from decreasing.

In addition, the width of the first gas generation part 8 may be no less than 50 and no more than 200, no less than 50 and no more than 80, or no less than 120 and no more than 200 when that of the second gas generation part 8 is 100. According to the above configuration, among the first gas generation part and the second gas generation part, the width of the part which is the hydrogen generation part can be greater than that of the part which is the oxygen generation part, and reduction in the hydrogen generation rate due to the difference between hydrogen generation amount and oxygen generation amount can be prevented.

In addition, among the first gas generation part 8 and the second gas generation part 7, the width of the part which is the hydrogen generation part may be greater than that of the part which is the oxygen generation part. In addition, the width of the part which is the hydrogen generation part may be from 1.2 to 2.5 times greater than that of the part which is the oxygen generation part. In addition, among the first gas generation part 8 and the second gas generation part 7, the width of the part which is the hydrogen generation part may be substantially two times greater than that of the part which is the oxygen generation part. In addition, in conformity to the width, the ratio of the width of the electrolytic solution path 15 on top of the hydrogen generation part and the width of the electrolytic solution path 15 on top of the oxygen generation part may be substantially 2:1. Because the ratio of hydrogen and oxygen generated from water is 2:1, when the activity of the hydrogen generation catalyst contained in the hydrogen generation part is equivalent to that of the oxygen generation catalyst contained in the oxygen generation part, and when the load of the hydrogen generation catalyst is equivalent to that of the oxygen generation catalyst, effects on the hydrogen generation rate and the oxygen generation rate due to accumulation of bubbles or gas can be almost the same, and then hydrogen can be efficiently generated.

In addition, at least one of the first gas generation part 8 and the second gas generation part 7 preferably has a catalytic surface area larger than the area of the light acceptance surface. According to the above configuration, hydrogen or oxygen can be more efficiently generated by the electromotive force generated in the photoelectric conversion part.

In addition, at least one of the first gas generation part and the second gas generation part is preferably a catalyst-supporting porous conductor. According to the above configuration, at least one of the first gas generation part and the second gas generation part has the large catalytic surface area, so that oxygen or hydrogen can be more efficiently generated. In addition, by using the porous conductor, a potential can be suppressed from varying due to the current flowing between the photoelectric conversion part and the catalyst, so that hydrogen or oxygen can be more efficiently generated.

10. Hydrogen Generation Part

The hydrogen generation part is the part to generate $H_2$ from the electrolytic solution, and it is the first gas generation part 8 or the second gas generation part 7. Also, it is believed that the proton concentration of the electrolytic solution is reduced because hydrogen is generated from the electrolytic solution around the hydrogen generation part. The reduction in the proton concentration is eliminated by conducting protons between the electrolytic solution around the hydrogen generation part and the electrolytic solution around the oxygen generation part.

In addition, the hydrogen generation part may contain a catalyst for the reaction to generate $H_2$ from the electrolytic solution. In this case, the reaction rate to generate $H_2$ from the electrolytic solution can increase. The hydrogen generation part may be formed of only the catalyst for the reaction to generate $H_2$ from the electrolytic solution, and the catalyst may be supported by a carrier. In addition, the hydrogen generation part may have a catalytic surface area larger than the area of the light acceptance surface of the photoelectric conversion part 2. In this case, the reaction rate to generate $H_2$ from the electrolytic solution can become higher. In addition, the hydrogen generation part may be a catalyst-supporting porous conductor. In this case, the catalytic surface area can increase. In addition, the potential can be prevented from varying due to the current flowing between the light acceptance surface or the back surface of the photoelectric conversion part 2 and the catalyst contained in the hydrogen generation part. In addition, when the hydrogen generation part is the first gas generation part 8, the potential can be prevented from varying due to the current flowing between the back surface of the photoelectric conversion part 2 and the catalyst even when the second electrode is not provided. Furthermore, the hydrogen generation part may contain at least one of Pt, Ir, Ru, Pd, Rh, Au, Fe, Ni, and Se as a hydrogen generation catalyst. According to the above configuration, hydrogen can be generated at higher reaction rate by the electromotive force generated in the photoelectric conversion part.

The catalyst for the reaction to generate $H_2$ from the electrolytic solution (hydrogen generation catalyst) is provided to promote conversion from two protons and two electrons to one hydrogen molecule, and can be made of a material which is chemically stable and having a small hydrogen generation overvoltage. Examples of the hydrogen generation catalyst include: a platinum group metal such as Pt, Ir, Ru, Pd, Rh, or Au having a catalytic activity for hydrogen, an alloy thereof, and a compound containing the platinum group metal; and an alloy containing any of metals such as Fe, Ni and Se constituting an activity center of a hydrogenase as a hydrogen generating enzyme, and a compound containing the metal, and these examples and combinations thereof can be desirably used as the hydrogen generation catalyst. Among them, Pt and a nanostructured body containing Pt are preferably used because their hydrogen generation overvoltage is low. A material such as CdS, CdSe, ZnS, or $ZrO_2$ which generate the hydrogen generation reaction by light irradiation can be also used.

While the hydrogen generation catalyst may be directly supported on the back surface of the photoelectric conversion part 2, the catalyst can be supported on a conductor in order to increase the reaction area and improve gas generation rate. As the conductor to support the catalyst, it may be a metal material, a carbonaceous material, or an inorganic material having conductivity.

The metal material is preferably a material having electron conductivity and having corrosion resistance under an acidic atmosphere. More specifically, the material may be a noble metal such as Au, Pt, or Pd, a metal such as Ti, Ta, W, Nb, Ni, Al, Cr, Ag, Cu, Zn, Su, or Si, a nitride and carbide of the above metal, a stainless steel, or an alloy such as Cu—Cr, Ni—Cr, or Ti—Pt. The metal material more preferably contains at least one element selected from a group including Pt, Ti, Au, Ag, Cu, Ni, and W because another chemical side reaction is hardly generated. This metal material is relatively low in electric resistance and can prevent a voltage from being lowered even when a current is drawn in a surface direction. In addition, when the metal material having poor corrosion resistance under the acidic atmosphere such as Cu, Ag, or Zn is used, a surface of the metal material having the poor corrosion resistance may be coated with a noble metal or metal having the corrosion resistance such as Au, Pt, or Pd, carbon, graphite, glassy carbon, a conductive polymer, conductive nitride, conductive carbide, or conductive oxide.

As the carbonaceous material, it is preferable that it is chemically stable and has conductivity. For example, the material may be carbon powder or carbon fiber such as acetylene black, vulcanized fiber, ketjen black, furnace black, VGCF, carbon nanotube, carbon nanohorn, or fullerene.

As the inorganic material having the conductivity, it may be In—Zn—O (IZO), In—Sn—O (ITO), ZnO—Al, Zn—Sn—O, $SnO_2$, or antimony oxide doped tin oxide.

In addition, as the conductive polymer, it may be polyacethylene, polythiophene, polyaniline, polypyrrole, polyparaphenylene, or polyparaphenylenevinylene, and as the conductive nitride, it may be carbon nitride, silicon nitride, gallium nitride, indium nitride, germanium nitride, titanium nitride, zirconium nitride, or thallium nitride, and as the conductive carbide, it may be tantalum carbide, silicon carbide, zirconium carbide, titanium carbide, molybdenum carbide, niobium carbide, iron carbide, nickel carbide, hafnium carbide, tungsten carbide, vanadium carbide, or chrome carbide, and as the conductive oxide, it may be tin oxide, indium tin oxide (ITO), or antimony oxide doped tin oxide.

A structure of the conductor to support the hydrogen generation catalyst may be preferably selected from a plate shape, foil shape, rod shape, mesh shape, lath plate shape, porous plate shape, porous rod shape, woven cloth shape, unwoven cloth shape, fiver shape, and a felt shape. In addition, the conductor having a groove formed by being pressed in a surface of a felt-shape electrode is preferably used because it can reduce electric resistance and flow resistance of an electrode liquid.

11. Oxygen Generation Part

The oxygen generation part is the part to generate $O_2$ from the electrolytic solution, and it is the first gas generation part 8 or the second gas generation part 7. Also, it is believed that the proton concentration of the electrolytic solution is increased because oxygen is generated from the electrolytic solution around the oxygen generation part. The increase in the proton concentration is eliminated by conducting protons between the electrolytic solution around the oxygen generation part and the electrolytic solution around the hydrogen generation part.

In addition, the oxygen generation part may contain a catalyst for the reaction to generate $O_2$ from the electrolytic solution. In this case, the reaction rate to generate $O_2$ from the electrolytic solution can increase. The oxygen generation part may be formed of only the catalyst for the reaction to generate $O_2$ from the electrolytic solution, and the catalyst may be supported by a carrier. In addition, the oxygen generation part may have a catalytic surface area larger than the area of the light acceptance surface of the photoelectric conversion part 2. In this case, the reaction rate to generate $O_2$ from the electrolytic solution can increase. In addition, the oxygen generation part may be a catalyst-supporting porous conductor. In this case, the catalytic surface area can increase. In addition, the potential can be prevented from varying due to the current flowing between the light acceptance surface or the back surface of the photoelectric conversion part 2 and the catalyst contained in the oxygen generation part. In addition, when the hydrogen generation part is the first gas generation part 8, the potential can be prevented from varying due to the current flowing between the back surface of the photoelectric conversion part 2 and the catalyst even when the second electrode is not provided. Furthermore, the oxygen generation part may contain at least one of Mn, Ca, Zn, Co, and Ir, as an oxygen generation catalyst. According to the above configuration, oxygen can be generated at higher reaction rate by the electromotive force generated in the photoelectric conversion part.

The catalyst for the reaction to generate $O_2$ from the electrolytic solution (oxygen generation catalyst) is provided to promote conversion from two water molecules to one oxygen, four protons and four electrons, and made of a material which is chemically stable and having a small oxygen generation overvoltage. For example, the materials include an oxide or compound containing Mn, Ca, Zn or Co serving as an active center of Photosystem II which is an enzyme to catalyze the reaction to generate oxygen from water using light, a compound containing a platinum group metal such as Pt, $RuO_2$, or $IrO_2$, an oxide or a compound containing a transition metal such as Ti, Zr, Nb, Ta, W, Ce, Fe, or Ni, and a combination of the above materials. Among them, an iridium oxide, manganese oxide, cobalt oxide, or cobalt phosphate is preferably used because an overvoltage is low and oxygen generation efficiency is high.

While the oxygen generation catalyst may be directly supported on the back surface of the photoelectric conversion part 2, the catalyst can be supported on a conductor in order to increase the reaction area and improve gas generation rate. As the conductor to support the catalyst, it may be a metal material, a carbonaceous material, or an inorganic material having conductivity. Their explanations are relevant to those described for the hydrogen generation part in "10. Hydrogen generation part" as long as there is no inconsistency.

When the catalytic activities of the single hydrogen generation catalyst and the single oxygen generation catalyst are small, an auxiliary catalyst may be used, such as an oxide of Ni, Cr, Rh, Mo, Co, or Se or a compound of them.

In addition, a method for supporting the hydrogen generation catalyst and the oxygen generation catalyst may be a method performed by directly applying it to the conductor or the semiconductor, a PVD method such as a vapor deposition method, sputtering method, or ion plating method, a dry coating method such as a CVD method, or an electro-crystallization method, depending on the material. A conductive substance can be supported between the photoelectric conversion part and the catalyst. In addition, when the catalytic activities for the hydrogen generation and the oxygen generation are not sufficient, the catalyst is supported on a porous body, a fibrous substance or a nanoparticle of metal or carbon, to increase the reaction surface area, whereby the hydrogen and oxygen generation rate can be improved.

12. Plate

The plate 14 can be provided over the first gas generation part 8 and the second gas generation part 7 so as to be opposed to the substrate 1. In addition, the plate 14 can be provided such that a space is provided between the first gas generation part 8 and the second gas generation part 7, and the plate 14.

In addition, the plate 14 constitutes the path of the electrolytic solution and is provided to confine the generated hydrogen and oxygen, so that it is made of a material having high air leakage efficiency. While the material is not limited to be transparent or opaque, it is preferably transparent because it can be observed that hydrogen and oxygen are generated. The transparent plate is not limited in particular, and it may be a transparent rigid material such as quartz glass, Pyrex (registered trademark), or a synthetic quartz plate, a transparent resin plate, or a film material. Among them, the glass material is preferably used because it does not transmit a gas and it is stable chemically and physically.

13. Partition Wall

The partition wall 13 can be provided to separate a space between the first gas generation part 8 and the second gas generation part 7. Also, the partition wall 13 can be provided to separate a space between the first gas generation part 8 and the plate 14, and a space between the second gas generation part 7 and the plate 14. Thus, the hydrogen and oxygen generated in the first gas generation part 8 and the second gas generation part 7 are prevented from being mixed, so that the hydrogen and oxygen are separately collected.

In addition, the partition wall 13 may contain an ion exchanger. In this case, it can equalize a proton concentration which became unbalanced between the electrolytic solution in the space between the first gas generation part 8 and the plate 14, and the electrolytic solution in the space between the second gas generation part 7 and the plate 14. That is, proton ions are moved through the partition wall 13 to eliminate the imbalance in proton concentration.

Figure 7:
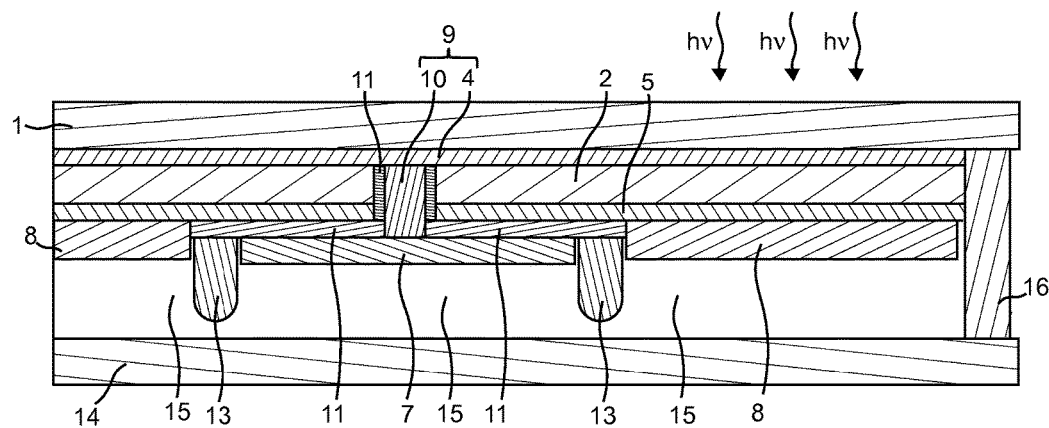
FIG. 7 is a schematic cross-sectional view showing a configuration of a hydrogen production device according to an embodiment of the present invention.

The partition wall 13 may be provided so as to be in contact with the plate 14 as shown in FIG. 2, or may be provided so as to leave a space between the plate 14 and the partition wall 13 as shown in FIG. 7. When it is provided as shown in FIG. 7, the imbalance in proton can be more easily eliminated. In addition, the partition wall 13 may have a hole. In this case, the imbalance in proton can be more easily eliminated. In addition, even when the space is provided between the plate 14 and the partition wall 13, hydrogen and oxygen can be prevented from being mixed by setting the hydrogen production device with the light acceptance surface of the photoelectric conversion part 2 facing upward. In addition, hydrogen and oxygen can be prevented from being mixed by providing the hole in the partition wall 13 closer to the plate 14.

While the partition wall 13 completely separate the electrolytic solution path 15 provided between the first gas generation part 8 and the plate 14, and the electrolytic solution path 15 provided between the second gas generation part 7 and the plate 14 in FIG. 2, the partition wall 13 can be set so as to form a gas flow path as shown in FIG. 7 when there is no trouble in the ion movement between the above electrolytic solution paths. In this case, as shown in FIG. 7, the partition wall 13 to prevent the generated hydrogen and oxygen from being mixed can be set by a lower cost means such as printing method. In this case, the substrate 1 and the plate 14 are connected with the seal material 16. In order to increase stability of the structure, the partition wall 9 may be provided so as to be partially in contact with the plate 14.

The partition wall 9 may have a strip-shaped cross-section which is parallel with the back surface of the photoelectric conversion part 2, and the cross-section may have a width of no less than 1 cm and no more than 5 cm. Further, it may have a width of no less than 1 cm and no more than 3 cm. According to the above configuration, generated hydrogen can be more efficiently collected, and the space between the first gas generation part and the second gas generation part can be further shortened, and the imbalance in the proton concentration can be further decreased.

A ratio between a hydrogen generation amount and an oxygen generation amount from the electrolytic solution is 2:1 in molar ratio, and a gas generation amount differs between the first gas generation part 8 and the second gas generation part 7. Therefore, with a view to keeping a water content in the device constant, the partition wall 13 is preferably made of a material which transmits water. The partition wall 13 may be an inorganic film made of porous glass, porous zirconia, or porous alumina, or an ion exchanger.

The ion exchange may be any well-known ion exchanger, such as a proton-conducting film, cation-exchanging film, or anion-exchanging film.

A material for the proton-conducting film is not limited in particular as long as it has proton-conducting and electrically insulating properties, such as a polymer film, inorganic film, or composite film.

The polymer film may be a perfluoro sulfonate series electrolytic film such as Nafion (registered trademark) made by Du Pont, Aciplex (registered trademark) made by Asahi Kasei Corporation, or Flemion (registered trademark) made by Asahi Glass Co., Ltd., or a carbon hydride series electrolytic film formed of polystyrene sulfonate, sulfonated polyether ether ketone, or the like.

The inorganic film may be a film made of glass phosphate, cesium hydrogen sulfate, polytungsto phosphate, ammonium polyphosphate, or the like. The composite film is formed of an inorganic substance such as a sulfonated polyimide series polymer, or tungsten acid, and an organic substance such as polyimide, and more particularly, GORE-SELECT (registered trademark) made by Gore & Associates Inc., a pore-filling electrolytic film, or the like. Furthermore, when it is used in a high-temperature atmosphere (such as 100° C. or more), the material may be sulfonated polyimide, 2-acrylamide-2-methylpropane sulfonate (AMPS), sulfonated polybenzimidazole, phosphonated polybenzimidazole, cesium hydrogen sulfate, ammonium polyphosphate, or the like.

The cation-exchanging film may be a solid polymer electrolyte which can move cation. More specifically, it may be a fluorine series ion-exchanging film such as a perfluoro carbon sulfonate film or perfluoro carbon carboxylic acid film, a poly-benz-imidazole film impregnated with phosphoric acid, a polystyrene sulfonate film, a sulfonated styrene-vinylbenzene copolymer film, or the like.

When an anion transport number in the support electrolytic solution is high, the anion-exchanging film is preferably used. As the anion-exchanging film, a solid polymer electrolyte which can move anion can be used. More specifically, it may be a polyortho phenylenediamine film, a fluorine series ion-exchanging film having an ammonium salt derivative group, a vinylbenzene polymer film having an ammonium salt derivative group, a film aminated with chloromethylstyrene-vinylbenzene copolymer, or the like.

When the hydrogen generation and the oxygen generation are selectively performed by the hydrogen generation catalyst and the oxygen generation catalyst, respectively, and the ions are moved accordingly, a member such as the specific film for the ion exchange is not always necessary. When the gas is only to be separated physically, an ultraviolet curing resin or thermal curing resin, which will be described below in the seal material, can be used.

14. Seal Material

The seal material 16 is the material to bond the substrate 1 and the plate 14, and to seal the electrolytic solution flowing in the hydrogen production device 23, and the hydrogen and oxygen generated in the hydrogen production device 23. The seal material 16 is preferably an ultraviolet curing adhesive or a thermal curing adhesive, but its kind is not limited. The ultraviolet curing adhesive is a resin which polymerizes by being irradiated with a light having a wavelength of 200 to 400 nm and cures in several seconds after being irradiated, and is divided into a radical polymerization type and a cation polymerization type, and the radical polymerization type resin is formed of acrylate or unsaturated polyester, and the cation polymerization type is formed of epoxy, oxetane, or vinyl ether. In addition, the thermal curing polymer adhesive may be an organic resin such as a phenol resin, epoxy resin, melamine resin, urea resin, or thermal curing polyimide. The thermal curing polymer adhesive successfully bonds the members by being heated and polymerizing under a pressed condition at the time of thermal compression and then being cooled down to room temperature while kept being pressed, so that a fastening member is not needed. In addition to the organic resin, a hybrid material having high adhesion to the glass substrate can be used. By using the hybrid material, mechanical characteristics such as elasticity and hardness are improved, and thermal resistance and chemical resistance can be considerably improved. The hybrid material is formed of inorganic colloidal particles and an organic binder resin. For example, it is formed of the inorganic colloidal particles such as silica, and the organic binder resin such as an epoxy resin, polyurethane acrylate resin, or polyester acrylate resin.

Here, the seal material 16 is shown, but this is not limited as long as it has a function to bond the substrate 1 and the plate 14, so that a method in which physical pressure is applied from the outside with a member such as a screw using a resin or metal gasket may be occasionally used to enhance the air tightness.

15. Electrolytic Solution Path

The electrolytic solution path 15 can be the space between the first gas generation part 8 and the plate 14, and the space between the second gas generation part 7 and the plate 14. In addition, the electrolytic solution path 15 can be separated by the partition wall 13.

In order to efficiently remove bubbles of the generated hydrogen and oxygen from the first gas generation part 8 or the second gas generation part 7, a simple device to circulate the electrolytic solution inside the electrolytic solution path, such as a pump, fan, or thermal convection generating device can be provided.

16. Water Intake, First Gas Exhaust Opening, Second Gas Exhaust Opening, First Gas Exhaust Path, and Second Gas Exhaust Path The water intake 18 can be provided by opening a part of the seal material 16 in the hydrogen production device 23. The water intake 18 is arranged to supply water to be converted to hydrogen and oxygen, and its position and shape are not limited in particular as long as the water as a raw material can be efficiently supplied to the hydrogen production device, but it is preferably provided at a lower part of the hydrogen production device in view of flowability and easiness of supply.

In addition, the first gas exhaust opening 20 and the second gas exhaust opening 19 can be provided by opening an upper part of the hydrogen production device 23 after the hydrogen production device 23 has been set with the water intake 18 provided on the lower side. In addition, the first gas exhaust opening 20 may be provided outside of one of short sides of the first gas generation part, the second gas exhaust opening 19 may be provided outside of one of short sides of the second gas generation part. In addition, the first gas exhaust opening 20 and the second gas exhaust opening 19 can be provided on the side of the first gas generation part 20 and on the side of the second gas generation part 19 across the partition wall 13, respectively.

Figure 8:
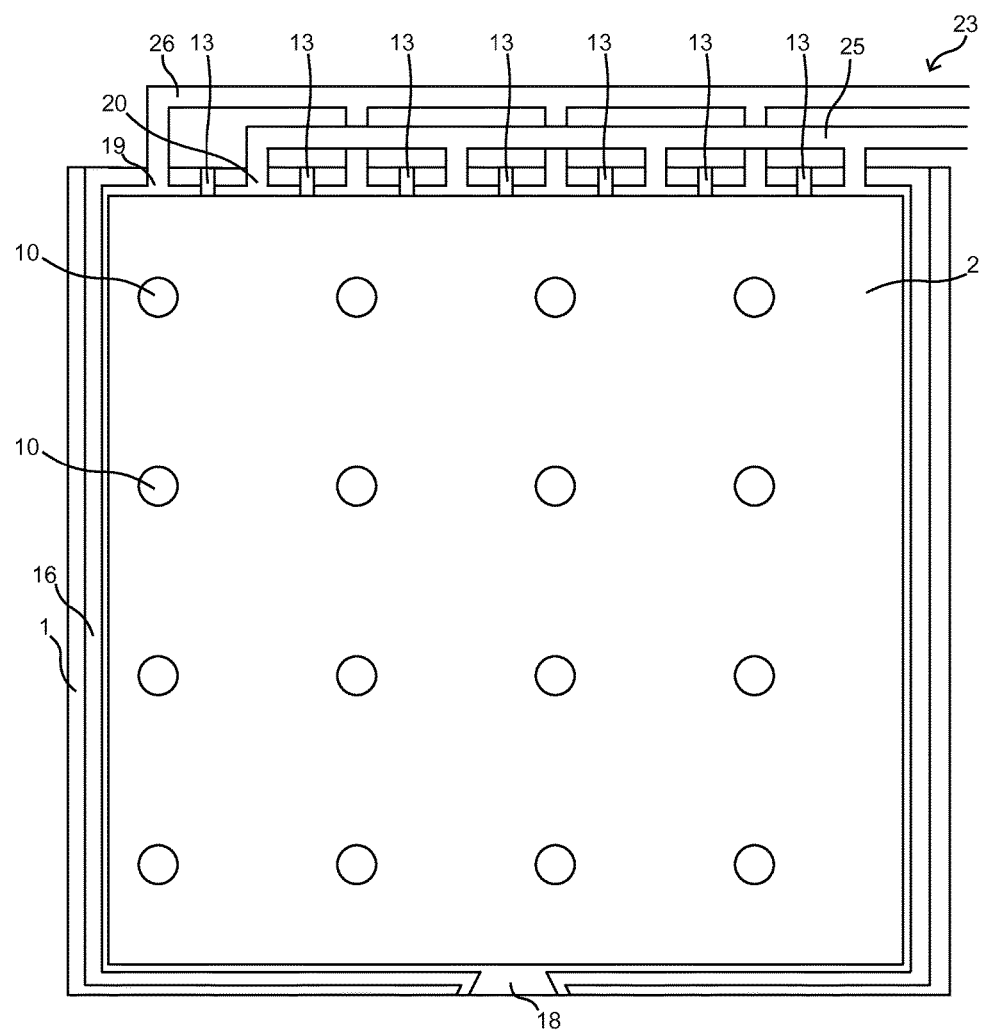
FIG. 8 is a schematic plan view showing a configuration of a hydrogen production device according to an embodiment of the present invention.

In addition, both of the first gas exhaust opening 20 and the second gas exhaust opening 19 are plural, and they may be provided so as to arrange alternately. In addition, the plurality of the first gas exhaust opening 20 may conduct with one first gas exhaust path 25, and the plurality of the second gas exhaust opening 19 may conduct with one second gas exhaust path 26, as shown in FIG. 8. Thereby, generated hydrogen can be easily collected, and the convenience can be improved.

By providing the water intake 18, the first gas exhaust opening 20, the second gas exhaust opening 19, the first gas exhaust path 25, and the second gas exhaust path 26 as described above, the hydrogen production device 23 can be set such that the light acceptance surface of the photoelectric conversion part 2 is tilted with respect to a horizontal surface under the condition that it faces upward, and the water intake 18 is positioned on the lower side, and the first gas exhaust opening 20 and the second gas exhaust opening 19 are positioned on the upper side. In this setting, the electrolytic solution can be introduced from the water intake 18 into the hydrogen production device 23, and the electrolytic solution path 15 is filled with the electrolytic solution. When light enters the hydrogen production device 23 in this state, hydrogen and oxygen are sequentially generated in the hydrogen generation part and the oxygen generation part, respectively. The generated hydrogen and oxygen can be separated by the partition wall 13, and the hydrogen and oxygen rise to the upper part of the hydrogen production device 23, and can be collected from the first gas exhaust path 25 and the second gas exhaust path 26.

17. Electrolytic Solution

The electrolytic solution is the water solution containing the electrolyte such as an electrolytic solution containing 0.1M of $H_2SO_4$, or a buffering solution containing 0.1 M of potassium phosphate.

EXAMPLES

The present invention will be described in more detail with reference to the following examples, but the present invention is not limited to these examples.

1. Example 1

The following hydrogen production device as shown in FIGS. 1 to 3 was produced.

In the produced hydrogen production device, an $SnO_2$ thin film serving as the first electrode 4 is formed on a glass substrate serving as the substrate 1. The three junction photoelectric conversion part 2 formed of an a-Si layer and the a-Si layer is laminated on the first electrode 4, and the second electrode 5 formed of a transparent electrode layer made of indium tin oxide (ITO) is provided thereon. The hydrogen generation part (first gas generation part 8) supporting the hydrogen generation catalyst is provided on the second electrode 5, while the oxygen generation part (second gas generation part 7) supporting the oxygen generation catalyst is provided so as to be isolated from the second electrode 5 with the insulation part 11 formed of a polyimide film and connected to the first electrode 4 through the second conductive part 10 made of an Ag paste. A plurality of the hydrogen generation part and a plurality of the oxygen generation part are arranged in tandem, the electrolytic solution path 15 serving as the water flow path is provided so as to have a structure in which the electrolytic solution flows on the layer of the hydrogen generation part and the oxygen generation part, and so as to be sandwiched between the substrate 1 and the glass plate 14, and the partition wall 13 formed of a glass filter is provided between the hydrogen generation part and the oxygen generation part to prevent hydrogen and oxygen from being mixed. Hereinafter, its production process will be described in detail.

As the substrate 1 and the first electrode 4, a U type glass substrate coated with tin dioxide ($SnO_2$) made by Asahi Glass Co., Ltd. was used.

Then, the a-Si film was formed by a plasma CVD method. First, a substrate temperature was set to 150° C., and a p layer was made of a-SiO having a film thickness of 20 nm using $SiH_4$ and $CO_2$ as main gasses, $B_2H_6$ as a doping gas and hydrogen as a diluent gas. Then, a photoelectric conversion layer having the pin junction was made by forming film of i layer of the a-SiO having a thickness of 200 nm using $SiH_4$ as a main gas, and $H_2$ as a diluent gas, and then forming film of n layer of the a-SiO having a thickness of 10 nm using $SiH_4$ and $CO_2$ as main gasses, $PH_3$ as a doping gas, and hydrogen as a diluent gas. After that, additional two photoelectric conversion layers having a pin junction are formed by the similar method, and photoelectric conversion part 2 composed of three photoelectric conversion layers was formed. Then, an ITO film having a thickness of 200 nm was formed by the sputtering method. The produced photoelectric conversion part 2 and the second electrode 5 were subjected to a photolithography process in which (1) a resist was applied to the silicon thin film, (2) the resist was exposed with a photomask to form a latent image of a mask pattern on the resist, (3) the resist was developed and patterned and the thin film is etched, and (4) the resist was removed, thereby patterned to form a contact hole.

Then, in order to form the insulation part 11 to insulate the second photoelectric conversion part 10 from the photoelectric conversion part 2 and the second electrode 5, a polyimide film was formed by applying a raw material by the spin coating method and baking it. Then, the Ag paste was applied onto the substrate by the screen printing method, and an iridium oxide sheet was arranged thereon, whereby the second conductive part 10 was formed in the contact hole and the oxygen generation part was formed by a heat treatment. In addition, a Pt film was formed on the second electrode 5 by the sputtering method to form the hydrogen generation part.

The porous glass partition wall 9 was disposed between the hydrogen generation catalyst and the oxygen generation catalyst, and the substrate and the plate, and the partition wall were connected with the seal material 13 formed of an acid-resistant epoxy resin, whereby the hydrogen production device according to the present invention was produced.

2. Example 2

The hydrogen production device as shown in FIG. 5 was produced on the following condition.

The photoelectric conversion part 2, the second electrode 5, the insulation part 11, the second conductive part 10, the oxygen generation part (second gas generation part 7), and the hydrogen generation part (first gas generation part 8) were formed on the substrate 1 by the same method as in the example 1. Here, this example is different from the example 1 in that the contact hole having the second conductive part 10 is provided along a longitudinal axis direction of the second gas generation part 7. In this case, since the number of the contact holes is reduced, a contact defect can be prevented, and a contact can be formed such that a cross-section area of the contact hole is narrower than a width of the second gas generation part 7 connected to the second conductive part 10 even when the width of the second gas generation part 7 is narrowed, so that hydrogen and oxygen can be efficiently produced.

3. Example 3

The hydrogen production device as shown in FIG. 7 was produced on the following condition.

The photoelectric conversion part 2, the second electrode 5, the insulation part 11, the second conductive part 10, the oxygen generation part (second gas generation part 7), and the hydrogen generation part (first gas generation part 8) were formed on the substrate 1 by the same method as in the example 1.

Then, as shown in FIG. 7, the partition wall 13 was formed by applying thermal curing polyimide to a position between the first gas generation part 8 and the second gas generation part 7 by a screen printing method so that the gas can be efficiently collected, and then the device was sealed by connecting the material on the substrate side and the plate with the seal material. Thus, the hydrogen production device was produced.

4. Example 4

The hydrogen production device as shown in FIG. 6 was produced on the following condition.

The photoelectric conversion part 2, the second electrode 5, the insulation part 11, the second conductive part 10, the oxygen generation part (second gas generation part 7), and the hydrogen generation part (first gas generation part 8) were formed on the substrate 1 by the same method as in the example 1. In this example, the difference from Example 1 is that the widths of the first gas generation part 8 and the second gas generation part 7 are different from those of Example 1. When a water molecule is electrolyzed, hydrogen molecule and oxygen molecule forms in a ratio of a hydrogen molecule to 0.5 oxygen molecule, so that the width of the catalyst layer can vary based on the activity of the catalyst and load of the catalyst and keep balance.

5. Example 5

In the hydrogen production device produced according to the example 1, the oxygen generation part was produced as follows.

To the cathode side of a glass electrochemical cell having a glass filter serving as a partition wall, a buffering solution containing 0.1 M of potassium phosphate and having pH 7 and 0.5 mM of cobalt nitrate were applied, and to the anode side thereof, a buffering solution containing 0.1 M of potassium phosphate and having pH 7 was applied. Porous carbon was dipped in the electrolytic solution on the cathode side, and Pt mesh was dipped in the anode electrolytic solution, to electrically connect both sides, and then a potential of 1.29 V (vs NHE) was applied thereto, whereby cobalt phosphate was supported on the porous carbon electrochemically. The oxygen generation catalyst produced as described above was formed on the second gas generation part 7 of the hydrogen production device in the example 1, so that the surface area can be large and the oxygen generation rate can be improved in the device.

6. Example 6

The hydrogen production device produced according to the example 1 was tilted so that sunlight could enter the light acceptance surface in a vertical direction. After pouring a catalyst containing 0.1 M of $H_2SO_4$ from the water intake 18 such that its liquid surface reached the vicinity of the first gas exhaust opening 20 and the second gas exhaust opening 19, and being irradiated with sunlight, it was confirmed by a gas chromatography that hydrogen and oxygen were generated from the first gas generation part 8 and the second gas generation part 7, respectively, and the hydrogen and oxygen were discharged from the first gas exhaust opening 20 and the first gas exhaust opening 20, respectively.

7. Example 7

The hydrogen production device having the oxygen generation catalyst produced according to the example 5 in the second gas generation part 7 was tilted so that sunlight can enter the light acceptance surface in a vertical direction. After pouring an electrolytic solution containing a buffering solution containing 0.1 M of potassium phosphate and having pH 7 from the water intake 18 such that its liquid surface reached the vicinity of the first gas exhaust opening 20 and the second gas exhaust opening 19, and being irradiated with sunlight, it was confirmed by a gas chromatography that hydrogen and oxygen were generated from the first gas generation part 8 and the second gas generation part 7, respectively, and the hydrogen and oxygen were discharged from the first gas exhaust opening 20 and the first gas exhaust opening 20, respectively. Thus, it was confirmed that the hydrogen could be produced even using the neutral electrolytic solution.

INDUSTRIAL APPLICABILITY

A hydrogen production device according to the present invention is used as an energy creating device to produce hydrogen and oxygen by decomposing water with energy from sunlight. Thus, hydrogen can be produced on-site at home, in a hydrogen station, and a large-scale hydrogen production plant.

DESCRIPTION OF SYMBOLS

1: substrate
2: photoelectric conversion part
4: first electrode
5: second electrode
7: second gas generation part
8: first gas generation part
9: first conductive part
10: second conductive part
11: insulation part
13: partition wall
14: plate
15: electrolytic solution path
16: seal material
18: water intake
19: second gas exhaust opening
20: first gas exhaust opening
23: hydrogen production device
25: first gas exhaust path
26: second gas exhaust path
28: photoelectric conversion layer
30: translucent electrode
31: backside electrode
33: third conductive part
35: semiconductor region
36: p-type semiconductor region
37: n-type semiconductor region
40: isolation
42: trench isolation
44: fifth conductive part
45: fourth conductive part

The invention claimed is:

1. A hydrogen production device comprising:
    a photoelectric conversion part having a light acceptance surface and a back surface;
    a first electrode provided on the acceptance surface of the photoelectric conversion part;
    a second electrode provided on the back surface of the photoelectric conversion part;
    a first insulating part provided on the second electrode and the side surface of the photoelectric conversion part,
    a first gas generation part provided on the second electrode,
    a second gas generation part provided on the first insulating part, and
    a first conductive part connecting the first electrode to the second gas generation part, wherein
    one of the first gas generation part and the second gas generation part is a hydrogen generation part to generate H2 from an electrolytic solution, and the other thereof is an oxygen generation part to generate O2 from the electrolytic solution,
    at least one of the first gas generation part and the second gas generation part is plural, and
    the photoelectric conversion part is electrically connected to the first gas generation part and the second gas generation part so that an electromotive force generated by a light acceptance of the photoelectric conversion part is supplied to the first gas generation part and the second gas generation part,
    the first gas generation part and the second gas generation part are provided alternately and in parallel,
    the first gas generation part is electrically connected to the back surface of the photoelectric conversion part via the second electrode, and
    the second gas generation part is electrically connected to the light acceptance surface of the photoelectric conversion part via the first electrode and the first conductive part.

2. The device according to claim 1, further comprising a partition wall between the first gas generation part and the second gas generation part.

3. The device according to claim 2, wherein the partition wall is provided to separate the space between the first gas generation part and the second gas generation part.

4. The device according to claim 2, wherein the first gas generation part and the second gas generation part are substantially rectangle, and the long side of the first gas generation part is provided to adjoin that of the second gas generation part across the partition wall.

5. The device according to claim 4, further comprising: a first gas exhaust opening provided outside of one of short sides of the first gas generation part; and a second gas exhaust opening provided outside of one of short sides of the second gas generation part, wherein
    the first gas exhaust opening and the second gas exhaust opening are provided next to each other.

6. The device according to claim 5, wherein both of the first gas exhaust opening and the second first gas exhaust opening are plural, the plurality of the first gas exhaust opening conducts with one first gas exhaust path, and the plurality of the second gas exhaust opening conducts with one second gas exhaust path.

7. The device according to claim 2, wherein the partition wall contains an ion-exchange material.

8. The device according to claim 1, wherein the second gas generation part is provided on the back surface of the photoelectric conversion part via a second insulation part.

9. The device according to claim 1, wherein the second electrode and the insulation part have a corrosion resistance and liquid-blocking properties to the electrolytic solution.

10. The device according to claim 1, wherein a second conductive part is provided in a contact hole penetrating the photoelectric conversion part.

11. The device according to claim 10, wherein the second conductive part has a cross-section which is parallel with the light acceptance surface of the photoelectric conversion part, and the cross-section has an elongate shape which is parallel with a column-wise of the first gas generation part and the second gas generation part.

12. The device according to claim 1, wherein the photoelectric conversion part is provided on a substrate having translucency.

13. The device according to claim 1, wherein the photoelectric conversion part has a photoelectric conversion layer formed of a p-type semiconductor layer, an i-type semiconductor layer, and an n-type semiconductor layer.

14. The device according to claim 1, wherein the photoelectric conversion part comprises a plurality of the photoelectric conversion layers connected in series, and the plurality of the photoelectric conversion layers output the electromotive force generated by receiving light to the first gas generation part and the second gas generation part.

15. The device according to claim 14, wherein each photoelectric conversion layer is connected in series with a third conductive part.

16. The device according to claim 15, wherein the third conductive part comprises a translucent electrode provided on the side of the light acceptance surface of the photoelectric conversion layer, and a backside electrode provided on the side of the back surface of the photoelectric conversion layer.

17. The device according to claim 1, further comprising an insulation part provided between the back surface of the photoelectric conversion part and the second gas generation part, and a fourth conductive part provided between the insulation part and the second gas generation part.

18. The device according to claim 1, further comprising an insulation part provided between the back surface of the photoelectric conversion part and the first gas generation part, and a fifth conductive part provided between the insulation part and the first gas generation part.

19. The device according to claim 1, wherein the hydrogen generation part and the oxygen generation part include a catalyst for a reaction to generate $H_2$ from the electrolytic solution, and a catalyst for a reaction to generate $O_2$ from the electrolytic solution, respectively.

20. The device according to claim 19, wherein at least one of the hydrogen generation part and the oxygen generation part is a catalyst-supporting porous conductor.

21. The device according to claim 1, wherein the photoelectric conversion part is provided on the substrate having translucency, and
further comprising: a plate provided over the first gas generation part and the second gas generation part so as to be opposed to the substrate; and a space provided between the first and the second gas generation parts and the plate.

22. The device according to claim 21, further comprising a partition wall between the first gas generation part and the second gas generation part, wherein the partition wall is provided to separate the space between the first gas generation part and the plate, and the space between the second gas generation part and the plate.

\* \* \* \* \*